(12) United States Patent
Harada

(10) Patent No.: US 10,192,625 B2
(45) Date of Patent: Jan. 29, 2019

(54) SEMICONDUCTOR MEMORY DEVICE AND MEMORY SYSTEM IN WHICH READ VOLTAGE IS SET BASED ON TRACKING READ VOLTAGE

(71) Applicant: Toshiba Memory Corporation, Tokyo (JP)

(72) Inventor: Yoshikazu Harada, Kawasaki Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/439,912

(22) Filed: Feb. 22, 2017

(65) Prior Publication Data
US 2018/0059936 A1    Mar. 1, 2018

(30) Foreign Application Priority Data

Aug. 29, 2016 (JP) ................ 2016-167314

(51) Int. Cl.
| | |
|---|---|
| G11C 16/26 | (2006.01) |
| G06F 11/10 | (2006.01) |
| G11C 16/34 | (2006.01) |
| G06F 11/00 | (2006.01) |
| G11C 11/56 | (2006.01) |
| G11C 16/32 | (2006.01) |
| G11C 7/10 | (2006.01) |
| G11C 16/04 | (2006.01) |

(52) U.S. Cl.
CPC .............. *G11C 16/26* (2013.01); *G06F 11/00* (2013.01); *G06F 11/10* (2013.01); *G06F 11/1068* (2013.01); *G11C 11/5642* (2013.01); *G11C 16/32* (2013.01); *G11C 16/34* (2013.01); *G11C 16/3427* (2013.01); *G11C 7/1063* (2013.01); *G11C 16/0483* (2013.01)

(58) Field of Classification Search
CPC ...... G11C 16/34; G06F 11/00; G06F 11/1068; G06F 11/10
See application file for complete search history.

(56) References Cited

U.S. PATENT DOCUMENTS 7,936,004 B2    5/2011   Kito et al.
8,625,347 B2    1/2014   Sakurada
(Continued)

FOREIGN PATENT DOCUMENTS

JP    2015-130444    7/2015

*Primary Examiner* — Vanthu T Nguyen
(74) *Attorney, Agent, or Firm* — Patterson & Sheridan, LLP

(57) ABSTRACT

A semiconductor memory device includes a memory cell array including a plurality of memory cells, a word line connected in common to gates of the memory cells, and a control circuit configured to execute a read operation on the memory cells by applying a first read voltage to the word line to determine for each of the memory cells whether or not the memory cell has a threshold voltage that is below the first read voltage and a second read voltage to the word line to determine for each of the memory cells whether or not the memory cell has a threshold voltage that is below the second read voltage. The control circuit determines the first read voltage by applying at least first to third voltages to the word line, and determines the second read voltage based on the first read voltage.

22 Claims, 19 Drawing Sheets

(56) References Cited

U.S. PATENT DOCUMENTS

| | | | |
|---|---|---|---|
| 9,122,626 B2 * | 9/2015 | Kim | G06F 11/1072 |
| 9,177,664 B2 | 11/2015 | Yang | |
| 9,190,159 B2 * | 11/2015 | Kurosawa | G11C 16/10 |
| 9,209,835 B2 * | 12/2015 | Alhussien | H03M 13/1125 |
| 9,922,707 B2 * | 3/2018 | Takada | G11C 11/5642 |
| 2013/0148436 A1 | 6/2013 | Kurosawa | |
| 2015/0085571 A1 * | 3/2015 | Hu | G11C 16/26 |
| | | | 365/185.03 |
| 2016/0049204 A1 | 2/2016 | Watanabe et al. | |

* cited by examiner

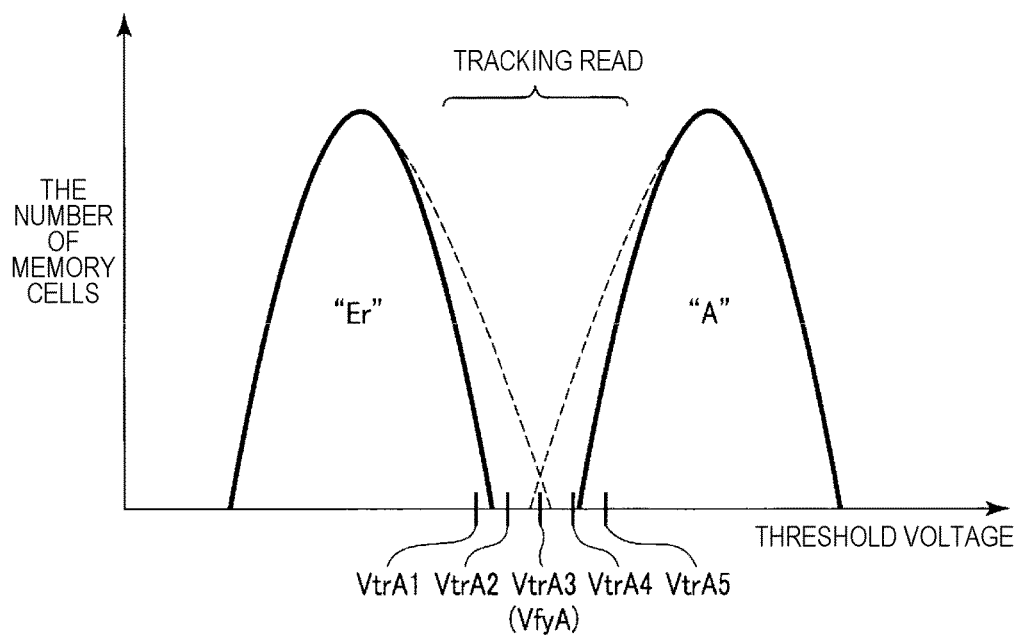

FIG. 7A

| Lower | Er | A | B | C | D | E | F | G |
|---|---|---|---|---|---|---|---|---|
| | 1 | 0 | 0 | 0 | 0 | 1 | 1 | 1 |
| 1 | – | VtrA1 | – | – | – | VfyE–Ve2 | – | – |
| 2 | – | VtrA2 | – | – | – | VfyE–Ve1 | – | – |
| 3 | – | VtrA3 (=VfyA) | – | – | – | VfyE | – | – |
| 4 | – | VtrA4 | – | – | – | VfyE+Ve1 | – | – |
| 5 | – | VtrA5 | – | – | – | VfyE+Ve2 | – | – |

FIG. 7B

| Middle | Er | A | B | C | D | E | F | G |
|---|---|---|---|---|---|---|---|---|
| | 1 | 1 | 0 | 0 | 1 | 1 | 0 | 0 |
| 1 | – | – | VtrB1 | – | VfyD–Vd2 | – | VfyF–Vf2 | – |
| 2 | – | – | VtrB2 | – | VfyD–Vd1 | – | VfyF–Vf1 | – |
| 3 | – | – | VtrB3 (=VfyB) | – | VfyD | – | VfyF | – |
| 4 | – | – | VtrB4 | – | VfyD+Vd1 | – | VfyF+Vf1 | – |
| 5 | – | – | VtrB5 | – | VfyD+Vd2 | – | VfyF+Vf2 | – |

FIG. 7C

| Upper | Er | A | B | C | D | E | F | G |
|---|---|---|---|---|---|---|---|---|
| | 1 | 1 | 1 | 0 | 0 | 0 | 0 | 1 |
| 1 | – | – | – | VtrC1 | – | – | – | VfyG–Vg2 |
| 2 | – | – | – | VtrC2 | – | – | – | VfyG–Vg1 |
| 3 | – | – | – | VtrC3 (=VfyC) | – | – | – | VfyG |
| 4 | – | – | – | VtrC4 | – | – | – | VfyG+Vg1 |
| 5 | – | – | – | VtrC5 | – | – | – | VfyG+Vg2 |

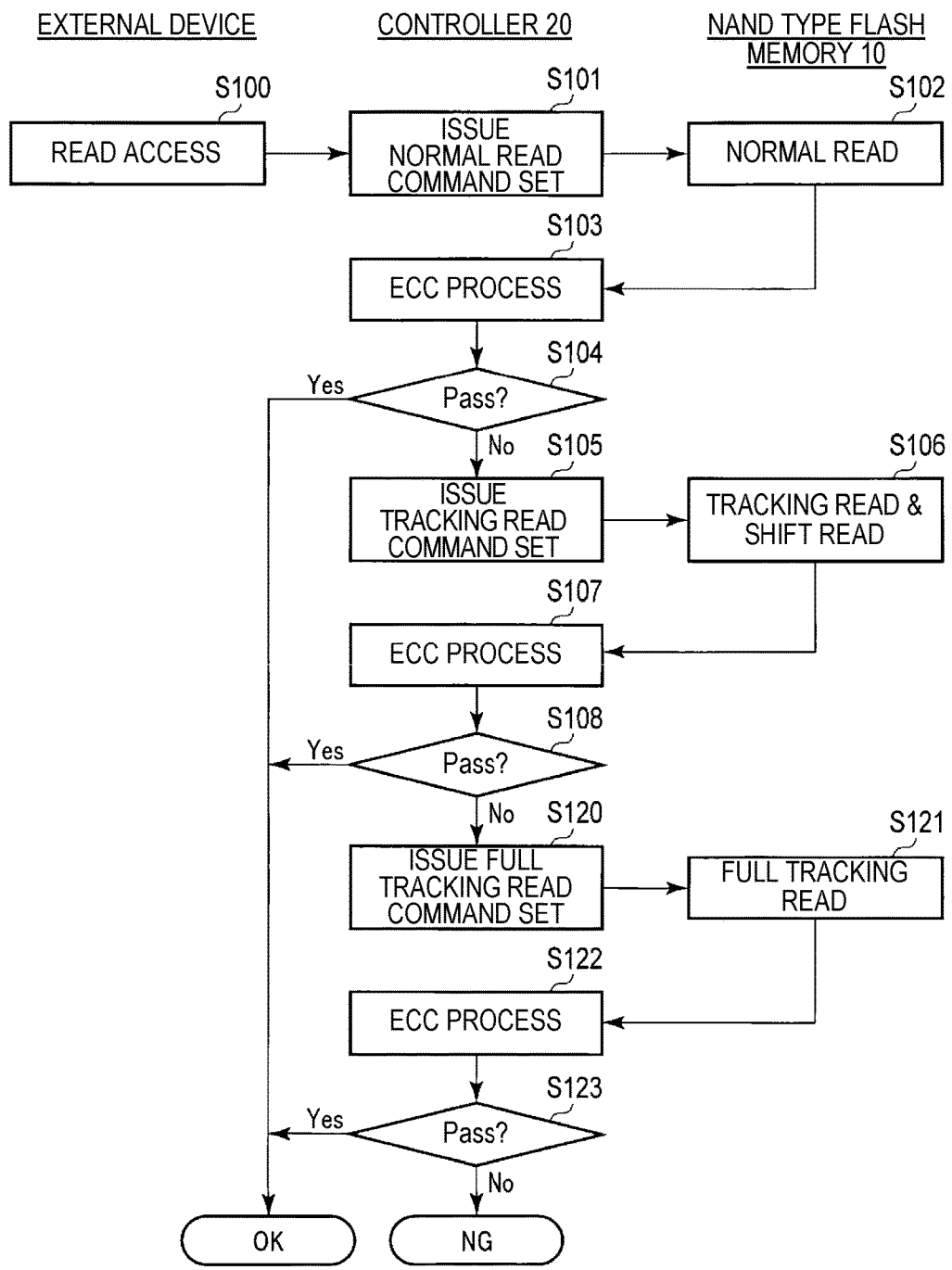

SEMICONDUCTOR MEMORY DEVICE AND MEMORY SYSTEM IN WHICH READ VOLTAGE IS SET BASED ON TRACKING READ VOLTAGE

CROSS-REFERENCE TO RELATED APPLICATION

This application is based upon and claims the benefit of priority from Japanese Patent Application No. 2016-167314, filed Aug. 29, 2016, the entire contents of which are incorporated herein by reference.

FIELD

Embodiments described herein relate generally to a semiconductor memory device and a memory system.

BACKGROUND

A NAND type flash memory has been known as a semiconductor memory device.

DESCRIPTION OF THE DRAWINGS

FIG. 6 is an explanatory view of a tracking read in the semiconductor memory device according to the first embodiment.

FIG. 7A is a read voltage table provided in the semiconductor memory device according to the first embodiment.

FIG. 7B is a read voltage table provided in the semiconductor memory device according to the first embodiment.

FIG. 7C is a read voltage table provided in the semiconductor memory device according to the first embodiment.

FIG. 21 is a flow chart illustrating the read operation in the memory system according to the sixth embodiment.

DETAILED DESCRIPTION

Figure 1:
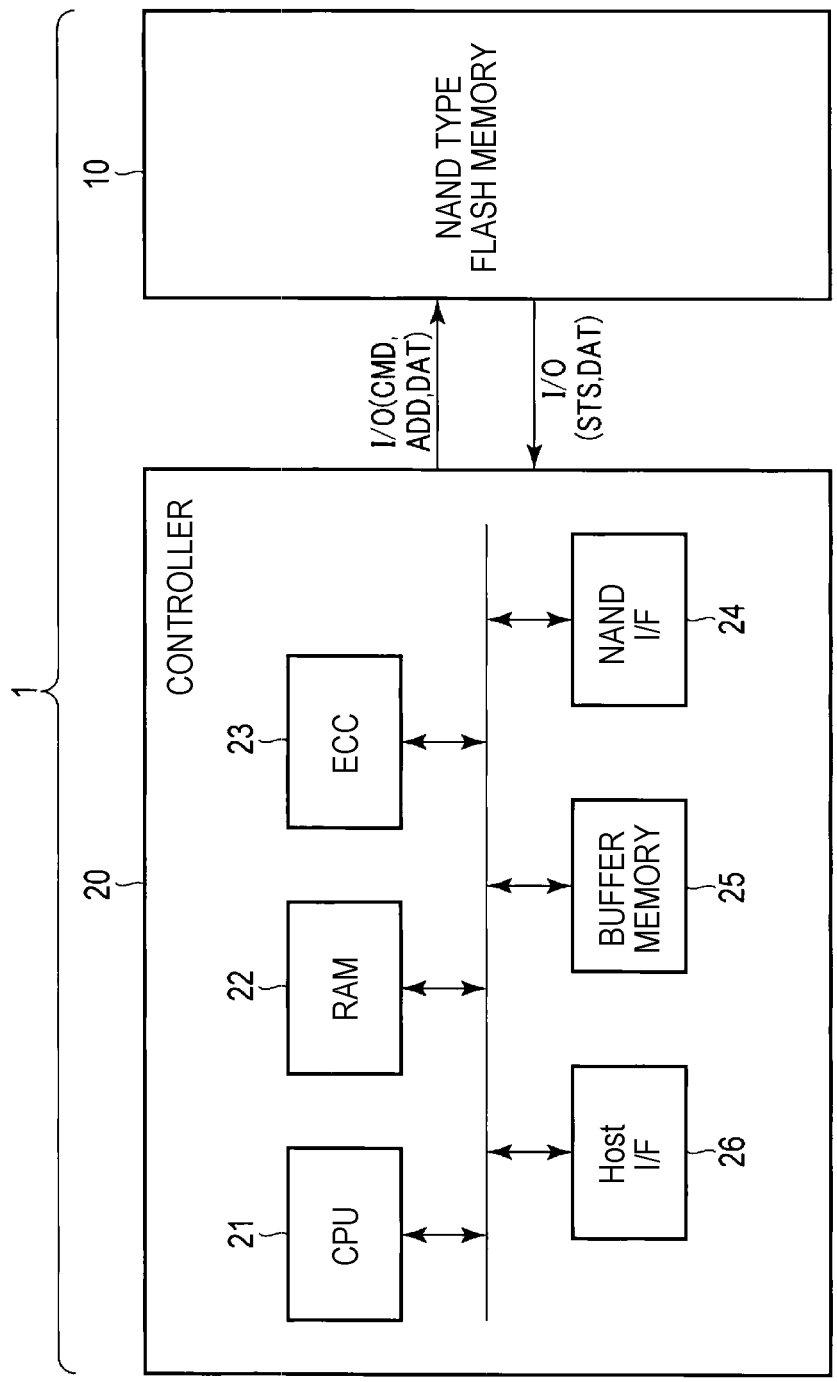
FIG. 1 is a block diagram of a memory system according to a first embodiment.

Embodiments provide a semiconductor memory device and a memory system having an improved processing capability.

According to one embodiment, a semiconductor memory device includes a memory cell array including a plurality of memory cells, a word line connected in common to gates of the memory cells, and a control circuit configured to execute a read operation by applying a first read voltage to the word line to determine for each of the memory cells whether or not the memory cell has a threshold voltage that is below the first read voltage and a second read voltage to the word line to determine for each of the memory cells whether or not the memory cell has a threshold voltage that is below the second read voltage. The control circuit determines the first read voltage by applying at least first to third voltages to the word line, and determines the second read voltage based on the first read voltage.

Hereinafter, embodiments are described with reference to the drawings. In the description, identical parts throughout the drawings are denoted by the same reference numerals.

1. First Embodiment

A semiconductor memory device and a memory system according to a first embodiment are described. Hereinafter, descriptions will be made for a flat NAND type flash memory in which memory cell transistors are two-dimensionally arranged on a semiconductor substrate, as an example of the semiconductor memory device.

1.1 Configuration 1.1.1 Configuration of Memory System

First, a configuration of the memory system is described using FIG. 1. FIG. 1 illustrates a block diagram of the memory system. As illustrated in FIG. 1, a memory system 1 includes a NAND type flash memory 10 and a controller 20.

The NAND type flash memory 10 stores data in a nonvolatile manner. A detailed configuration of the NAND type flash memory 10 will be described later.

The controller 20 issues commands for a read operation, a write operation, an erase operation and so on to the NAND type flash memory 10, in response to a command from an external host device (not illustrated). Further, the controller 20 manages a memory space in the NAND type flash memory 10.

As illustrated in FIG. 1, the controller 20 includes a processor (CPU) 21, a built-in memory (e.g., RAM) 22, an ECC circuit 23, a NAND interface circuit 24, a buffer memory 25, and a host interface circuit 26.

The processor 21 controls an operation of the entire controller 20. For example, the processor 21 issues a write command based on a NAND interface protocol in response to a write command received from the host device. This operation is similarly performed in the cases of read and erase operations.

The built-in memory 22 is, for example, a semiconductor memory such as a DRAM, and is used as a work area of the processor 21. The built-in memory 22 holds, for example, a firmware to manage the NAND type flash memory 10 or various management tables.

The ECC circuit 23 performs a data error checking and correcting (ECC) process. Specifically, the ECC circuit 23 produces parity based on write data when data is written. Then, the ECC circuit 23 produces a syndrome from the parity when data is read, so as to detect an error and correct the detected error.

The NAND interface circuit 24 is connected to the NAND type flash memory 10 to communicate with the NAND type flash memory 10. For example, the NAND interface circuit 24 transmits and receives an input/output signal I/O with the NAND type flash memory 10. For example, an input/output signal I/O that the controller 20 transmits to the NAND type flash memory 10 includes a command CMD, address information ADD, and a write data DAT. An input/output signal I/O that the controller 20 receives from the NAND type flash memory 10 includes status information STS and a read data DAT.

The buffer memory 25 temporarily holds, for example, the data that the controller 20 receives from the NAND type flash memory 10 and the host device.

The host interface circuit 26 is connected to the host device through a host bus (not illustrated) to communicate with the host device. For example, the host interface circuit 26 transmits a command and data received from the host device, to each of the processor 21 and the buffer memory 25.

1.1.2 Configuration of Semiconductor Memory Device

Figure 2:
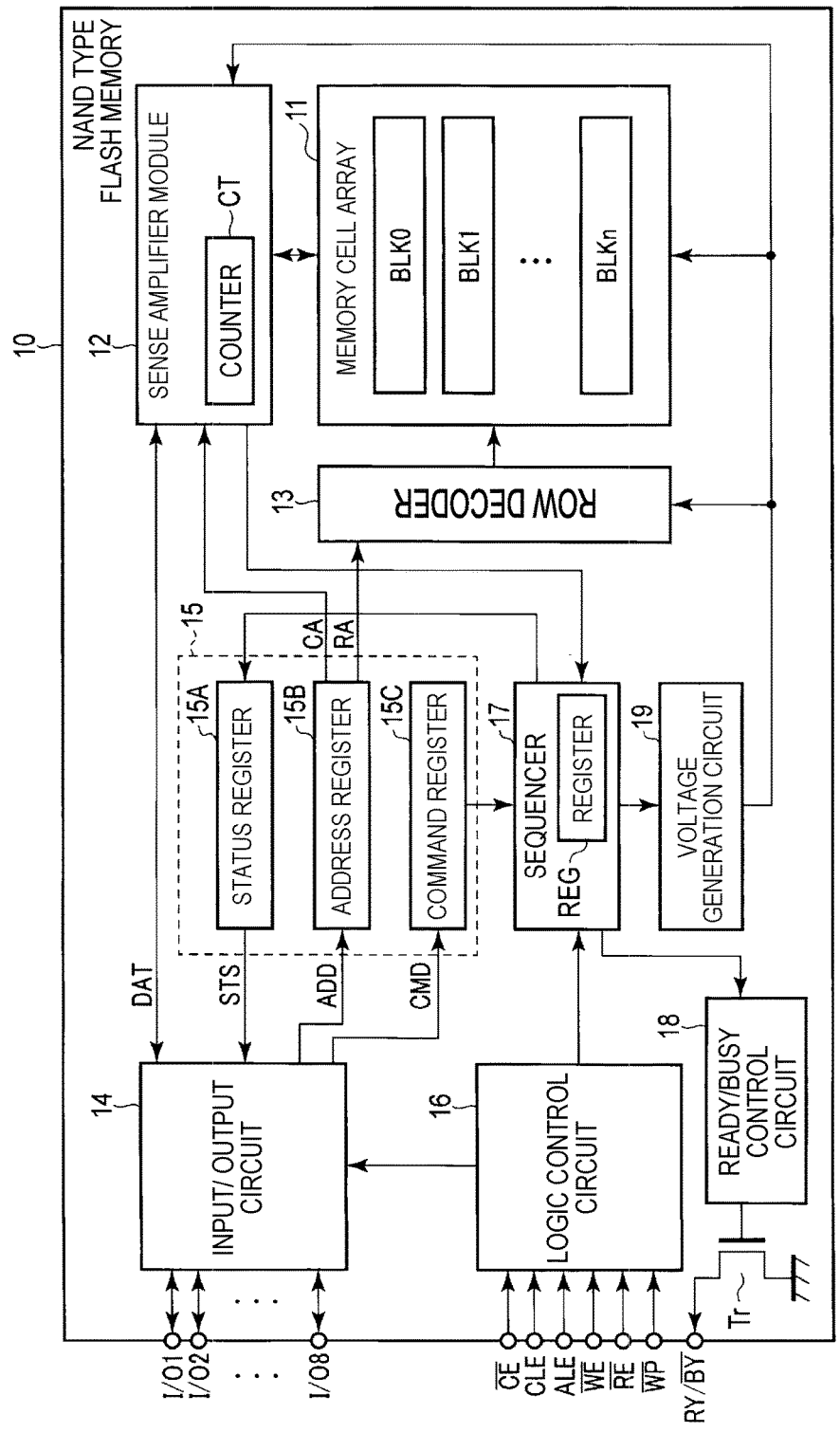
FIG. 2 is a block diagram of a semiconductor memory device according to the first embodiment.

Subsequently, a configuration of the NAND type flash memory 10 is described using FIG. 2. FIG. 2 illustrates a block diagram of the NAND type flash memory 10. As illustrated in FIG. 2, the NAND type flash memory 10 includes a memory cell array 11, a sense amplifier module 12, a row decoder 13, an input/output circuit 14, a register 15, a logic control circuit 16, a sequencer 17, a ready/busy control circuit 18, and a voltage generation circuit 19. Meanwhile, for simplification of description, the example of FIG. 2 illustrates a portion of connections among the circuits.

The memory cell array 11 includes blocks BLK0 to BLKn (n is a natural number equal to or more than 1). The blocks BLKs are a group of multiple nonvolatile memory cell transistors which are associated with bit lines and word lines, and represent, for example, a unit of data erase. Each memory cell transistor may store multiple-bit data by applying a multi-level cell (MLC) method.

The sense amplifier module 12 outputs data DAT read from the memory cell array 11 to the controller 20 through the input/output circuit 14. Further, the sense amplifier module 12 transmits write data DAT received from the controller 20 through the input/output circuit 14, to the memory cell array 11.

In addition, the sense amplifier module 12 includes a counter CT and a plurality of sense amplifier units (not illustrated) provided for the bit lines, respectively. The counter CT counts the number of ON cells of read data, i.e., the number of the memory cell transistors MT in an ON state, and transmits the counting result to the sequencer 17. Details of the sense amplifier units will be described later.

The row decoder 13 selects a word line corresponding to a memory cell transistor which is subject to a read operation and a write operation. Then, the row decoder 13 applies necessary voltages to the selected word line and a non-selected word line, respectively.

The input/output circuit 14 transmits and receives an input/output signal I/O (I/O1 to I/O8) having, for example, a 8-bit width, with respect to the controller 20. For example, the input/output circuit 14 transmits write data DAT included in an input/output signal I/O received from the controller 20, to the sense amplifier module 12. Further, the input/output circuit 14 transmits read data DAT transmitted from the sense amplifier module 12 as an input/output signal I/O to the controller 20.

The register 15 includes a status register 15A, an address register 15B, and a command register 15C. The status register 15A holds status information STS. Further, the status register 15A transmits the status information STS to the input/output circuit 14 according to an instruction of the sequencer 17. The address register 15B receives address information ADD from the input/output circuit 14, and holds the address information ADD. Further, the address register 15B transmits a column address signal CA and a row address signal RA included in the address information ADD to the sense amplifier module 12 and the row decoder 13, respectively. The command register 15C receives a command CMD from the input/output circuit 14, and holds the command CMD. Further, the command register 15C transmits the command CMD to the sequencer 17.

The logic control circuit 16 receives various control signals from the controller 20, and controls the input/output circuit 14 and the sequencer 17. As for the control signals, for example, a chip enable signal /CE, a command latch enable signal CLE, an address latch enable signal ALE, a write enable signal /WE, a read enable signal /RE, and a write protect signal /WP are used. The signal /CE is a signal that causes the NAND type flash memory 10 to be in an enable state. The signal CLE is a signal for notifying, to the input/output circuit 14, that a signal input to the NAND type flash memory 10 in parallel with an asserted signal CLE is a command CMD. The signal ALE is a signal for notifying, to the input/output circuit 14, that a signal input to the NAND type flash memory 10 in parallel with an asserted signal ALE is address information ADD. The signals /WE and /RE are signals for instructing input and output of, for example, the input/output signals I/O1 to I/O8 to the input/output circuit 14. The signal /WP is a signal for making the NAND type flash memory 10 to be in a write protection state, for example, when a power is turned ON/OFF.

The sequencer 17 controls the operation of the entire NAND type flash memory 10. Specifically, the sequencer 17 controls the sense amplifier module 12, the row decoder 13, the voltage generation circuit 19 and others based on a command CMD transmitted from the command register 15C, to perform a write operation, a read operation and so on of data. Further, the sequencer 17 may calculate a corrected value of an optimum read voltage based on a result of read operations performed a plurality of times using different read voltages. Details of the operation will be described later.

The sequencer 17 includes a register REG. The register REG holds a table related to a voltage which is applied to a word line during, for example, a read operation. The sequencer 17 may set a voltage during the read operation with reference to the table. The read table held in the register REG may be rewritten by, for example, a parameter write operation called a set feature.

The ready/busy control circuit 18 generates a ready/busy signal RY/(/BY) based on the operation state of the sequencer 17, and transmits the signal to the controller 20. The signal RY/(/BY) is a signal for notifying the controller 20 of whether the NAND type flash memory 10 is in a ready or busy state. The NAND type flash memory 10 in the ready state accepts a command from the controller 20, and in the busy state does not accept a command from the controller 20. In addition, the signal RY/(/BY) is generated when the ready/busy control circuit 18 controls the ON/OFF state of a transistor Tr connected to the output thereof. For example, in the signal RY/(/BY), the NAND type flash memory 10 becomes an "L" level (in the busy state) during a data read operation, and becomes an "H" level (in the ready state) when the operation is completed.

The voltage generation circuit 19 generates various voltages based on an instruction by the sequencer 17. Then, the voltage generation circuit 19 supplies the generated voltages to the memory cell array 11, the sense amplifier module 12, the row decoder 13 and others.

1.1.3 Configuration of Memory Cell Array

Figure 3:
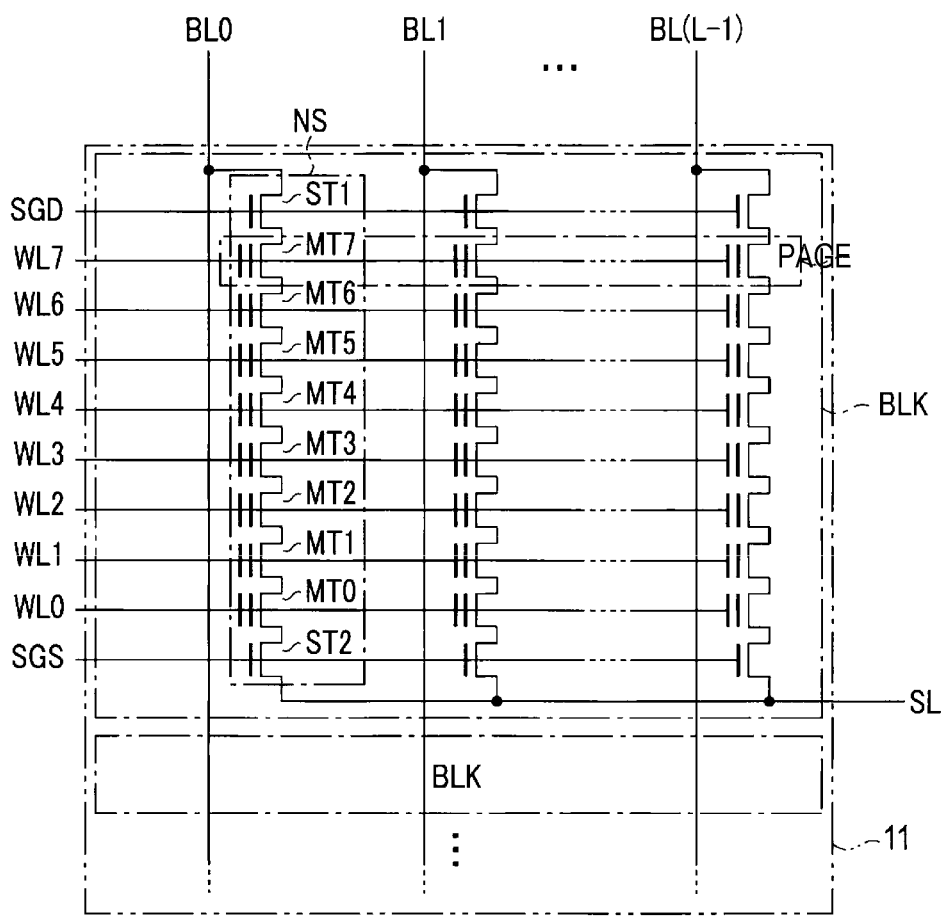
FIG. 3 is a circuit diagram of a memory cell array provided in the semiconductor memory device according to the first embodiment.

Subsequently, a configuration of the memory cell array 11 is described using FIG. 3. FIG. 3 is a circuit diagram of the memory cell array 11, and illustrates a detailed circuit configuration of one block BLK within the memory cell array 11. As illustrated in FIG. 3, the block BLK includes a plurality of NAND strings NS.

The NAND strings NS are provided to correspond to bit lines BL0 to BL(L−1) ((L−1) is a natural number equal to or more than 1), respectively. Each NAND string NS includes, for example, 8 memory cell transistors MT (MT0 to MT7) and selection transistors ST1 and ST2. The number of the memory cell transistors MT included in one NAND string NS is not limited thereto, and may be an arbitrary number.

The memory cell transistors MT have control gates and a charge storage layer, and hold data in a nonvolatile manner. Further, the memory cell transistors MT0 to MT7 are connected to each other in series between the source of the selection transistor ST1 and the drain of the selection transistor ST2. The gates of the selection transistors ST1 and ST2 within the same block BLK are connected in common to selection gate lines SGD and SGS, respectively. Likewise, the control gates of the memory cell transistors MT0 to MT7 within the same block BLK are connected in common to word lines WL0 to WL7, respectively.

In addition, the drains of the selection transistors ST1 in the NAND strings NS of the same column within the memory cell array 11 are connected in common to the bit lines BL. That is, the bit lines BL commonly connect the NAND strings NS of the same column across the plurality of blocks BLK. In addition, the sources of the plurality of selection transistors ST2 are connected in common to a source line SL.

In the above-described configuration, a group of 1-bit data held by a plurality of memory cell transistors MT connected to a common word line WL is referred to as a "page." Accordingly, for example, when 3-bit data is stored in one memory cell transistor MT, data corresponding to 3 pages is stored in a group of a plurality of memory cell transistors MT connected to one word line WL. Hereinafter, a page corresponding to an upper bit is referred to as an upper page, a page corresponding to a middle bit is referred to as a middle page, and a page corresponding to a lower bit is referred to as a lower page. In the present embodiment, description is made on a case where a memory cell transistor MT is able to hold 3-bit data. However, it is sufficient for a memory cell transistor MT to hold data of 2 or more bits.

In addition, a "page" includes a data area and a redundant area. The data area is an area where data that an external electronic device desires to save in the NAND type flash memory 10 is written. The redundant area is an area where data related to, for example, the data area is written.

Figure 4:
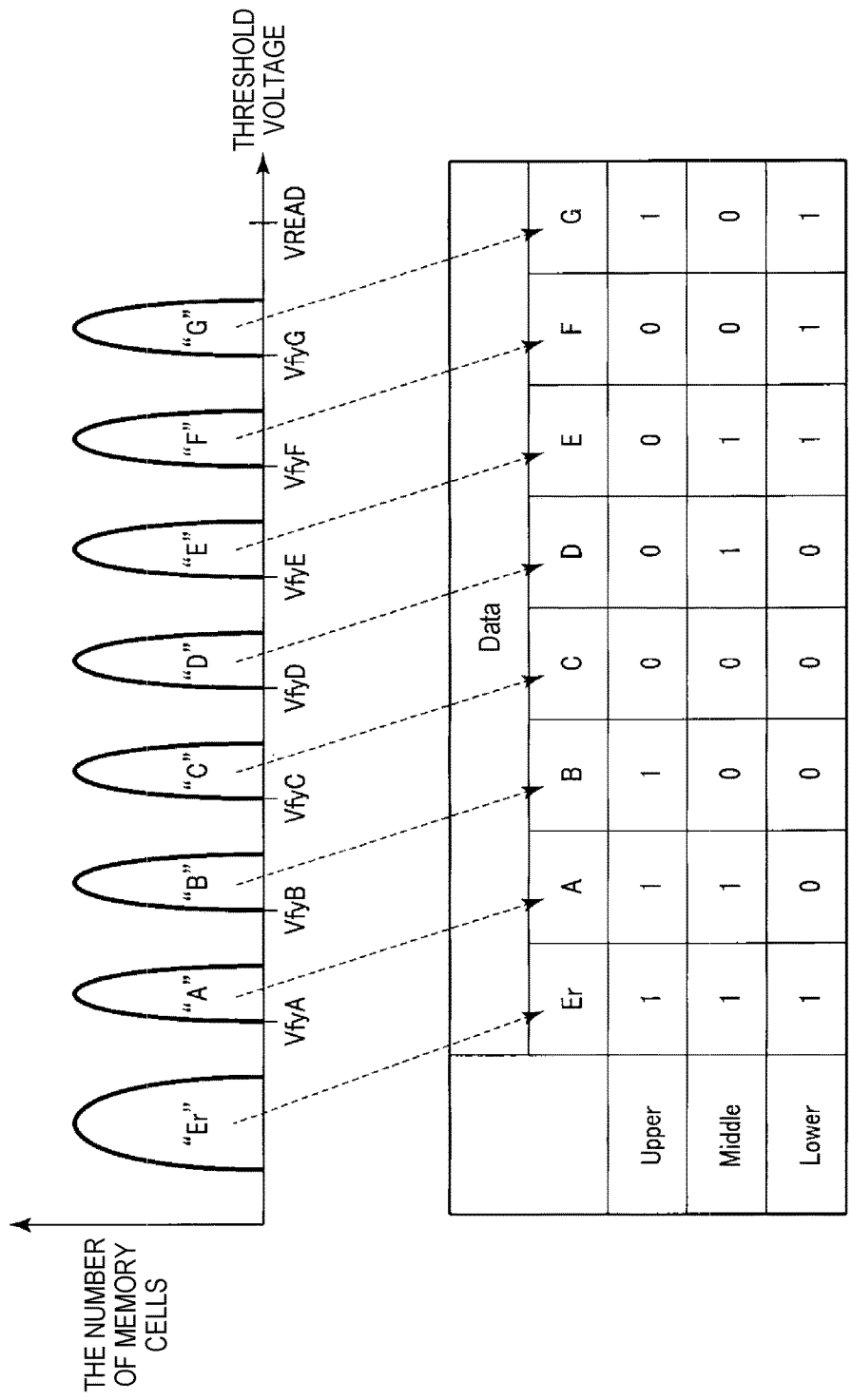
FIG. 4 is a view illustrating a threshold voltage distribution of a memory cell transistor provided in the semiconductor memory device according to the first embodiment.

Threshold voltage distributions of the above-described memory cell transistors MT are illustrated in FIG. 4. FIG. 4 illustrates threshold voltage distributions of the memory cell transistors MT which correspond to 3-bit data and a voltage used during a read operation. The vertical and horizontal axes of FIG. 4 correspond to the number of the memory cell transistors MT and a threshold voltage Vth, respectively.

As illustrated in FIG. 4, when a memory cell transistor MT holds 3-bit data, a threshold voltage of the memory cell transistor MT takes a value belonging to any one of, for example, eight discrete distributions. The eight distributions are referred to as an "Er" level, an "A" level, a "B" level, a "C" level, a "D" level, an "E" level, an "F" level, and a "G" level, respectively, in an order of ascending threshold voltages.

The "Er" level corresponds to, for example, a data erase state. A threshold voltage included in the "Er" level has a positive or negative value which is smaller than a voltage VfyA.

The "A" to "G" levels correspond to a state where charges are injected into the charge storage layer so that data is written, and a threshold voltage included in each of the distributions has, for example, a positive value. A threshold voltage included in the "A" level is equal to or more than the voltage VfyA and less than a voltage VfyB (where, VfyB>VfyA). A threshold voltage included in the "B" level is equal to or more than the voltage VfyB and less than a voltage VfyC (where, VfyC>VfyB). A threshold voltage included in the "C" level is equal to or more than the voltage VfyC and less than a voltage VfyD (where, VfyD>VfyC). A threshold voltage included in the "D" level is equal to or more than the voltage VfyD and less than a voltage VfyE (where, VfyE>VfyD). A threshold voltage included in the "E" level is equal to or more than the voltage VfyE and less than a voltage VfyF (where, VfyF>VfyE). A threshold value included in the "F" level is equal to or more than the voltage VfyF and less than a voltage VfyG (where, VfyG>VfyF). A threshold voltage included in the "G" level is equal to or more than the voltage VfyG and less than voltages VREAD and VPASS (where, VREAD>VfyG). Here, the voltages VREAD and VPASS are applied to non-selected word lines WL during a data read operation and a data write operation, respectively, so as to make the memory cell transistors MT to be in the ON state.

As described above, each of the memory cell transistors MT has one of the 8 threshold voltage distributions so that the memory cell transistors MT may take 8 types of states. When the states are allocated with binary notation of "000" to "111," each memory cell transistor MT may hold the 3-bit data. The bits of the 3-bit data may be referred to as an upper bit, a middle bit, and a lower bit, respectively.

Hereinafter, as for data allocation for the "Er" to "G" levels in the present embodiment, data of the "Er" level is "111," data of the "A" level is "110," data of the "B" level is "100," data of the "C" level is "000," data of the "D" level is "010," data of the "E" level is "011," data of the "F" level is "001," and data of the "G" level is "101." However, the data allocation for each of the levels may be set in any manner.

Although FIG. 4 illustrates the example where the 8 levels are discretely distributed, the distribution is an ideal state, for example, immediately after data write. Thus, in actuality, adjacent levels may overlap with each other. For example, the upper end of the "Er" level and the lower end of the "A" level may overlap with each other due to, for example, data retention after a write operation or read disturbance during a read operation.

1.1.4 Configuration of Sense Amplifier Module

Figure 5:
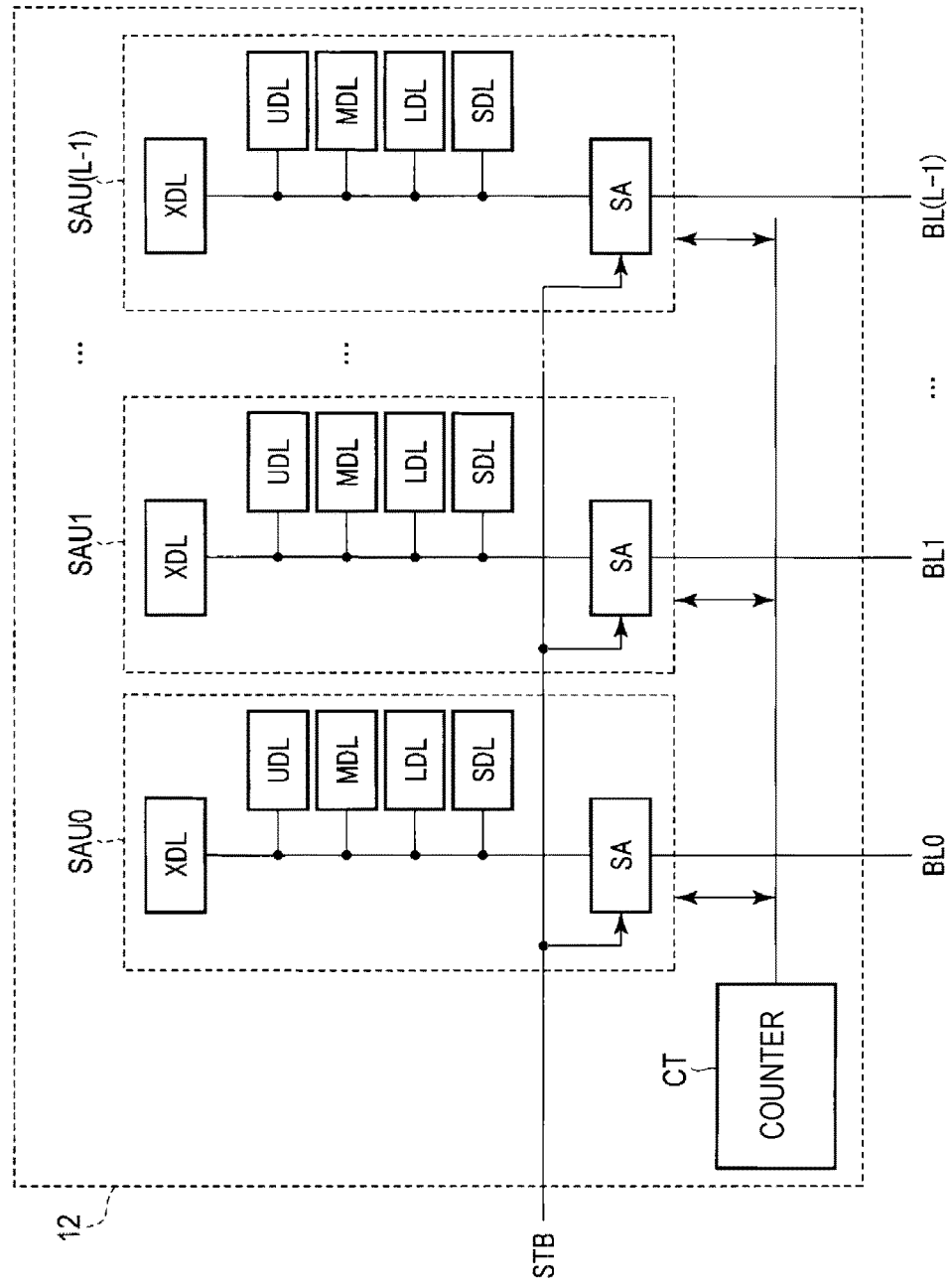
FIG. 5 is a block diagram of a sense amplifier module provided in the semiconductor memory device according to the first embodiment.

Subsequently, a configuration of the sense amplifier module 12 is described using FIG. 5. FIG. 5 is a circuit diagram of the sense amplifier module 12. As illustrated in FIG. 5, the sense amplifier module 12 includes sense amplifier units SAU (SAU0 to SAU (L-1)) provided in the respective bit lines BL.

Each sense amplifier unit SAU is connected to the counter CT to transmit/receive data with the counter CT. In addition, each sense amplifier unit SAU includes a sense amplifier SA and latch circuits SDL, LDL, MDL, UDL, and XDL. The sense amplifier SA and the latch circuits SDL, LDL, MDL, UDL, and XDL are connected to each other to transmit/receive data with each other.

During a read operation, the sense amplifier SA senses data read through a corresponding bit line BL thereof, and determines whether the read data is "0" or "1." Specifically, each sense amplifier unit SAU determines read data, for example, at a timing when a control signal STB generated by the sequencer 17 is asserted. During a write operation, the sense amplifier SA applies a voltage to a bit line BL based on write data.

The latch circuits SDL, LDL, MDL, and UDL temporarily hold the read data and the write data. The read data determined by the sense amplifier SA during the read operation and the write data transmitted to the latch circuit XDL during the writing operation are transmitted to, for example, any one of the latch circuits SDL, LDL, MDL, and UDL.

The latch circuit XDL is used for data input/output between each sense amplifier unit SAU and the controller 20. That is, data received from the controller 20 is transmitted to the latch circuit SDL, LDL, MDL or UDL, or the sense amplifier SA through the latch circuit XDL. In addition, data of the latch circuit SDL, LDL, MDL or UDL, or the sense amplifier SA is transmitted to the controller 20 through the latch circuit XDL.

The configuration of the sense amplifier module 12 is not limited to the above-described configuration, and may be variously modified. For example, the number of the latch circuits included in each sense amplifier unit SAU is designed based on the number of bits of data held by one memory cell transistor MT.

1.2 Read Operation

A read operation is described below. The NAND type flash memory 10 in the present embodiment may perform normal read, tracking read, and shift read. One or two or more of the operations are selected during a read operation so as to read data.

The normal read is a common read sequence and reads data by using a preset read voltage. For example, when the "A" level is read, the read voltage VfyA is used. The tracking read is a read sequence using a plurality of read voltages for one level in order to obtain an optimum read voltage. For example, when the "A" level is read, a plurality of read voltages including the voltage VfyA is used. The shift read is a read sequence using a corrected read voltage.

1.2.1 Tracking Read

The details of the tracking read are described using FIG. 6. FIG. 6 illustrates an example of a read voltage when the tracking read is applied to the read of the "A" level.

The threshold voltages of the memory cell transistors MT are affected by, for example, data retention after a write operation or read disturbance during a read operation. For example, the threshold voltage distributions of the memory cell transistors MT become high due to influence of the read disturbance, and become low due to influence of the data retention when charges are discharged from the memory cell transistors MT. As a result of the influence, the threshold voltage distributions of the memory cell transistors MT may become wide as represented by the dashed line in FIG. 6. The tracking read is performed when the threshold voltage distributions become wide as described above such that data may not be exactly read by, for example, the normal read.

In the tracking read, in order to calculate a corrected value of a read voltage, read operations using, for example, 5 read voltages VtrA1 to VtrA5 as illustrated in FIG. 6 are performed. The voltage values of the voltages VtrA1 to VtrA5 are different from each other, and a range of the voltage values is set to include a valley of adjacent threshold voltage distributions. For example, when the "A" level is read, the relationship of VtrA1<VfyA<VtrA5 is established. Hereinafter, description is made on a case where the read voltage VtrA3=VfyA. The sequencer 17 selects an optimum read voltage based on the read result of the voltages VtrA1 to VtrA5. In this case, the number of read times for tracking read of one level (the number of voltage steps) is arbitrary.

Specifically, for each read operation in the tracking read, the counter CT counts the number of ON cells, and transmits information of the number of ON cells to the sequencer 17. More specifically, for example, when the "A" level is read, the counter CT transmits the numbers of ON cells OA1 to OA5 read by the voltages VtrA1 to VtrA5, respectively, to the sequencer 17. Then, the sequencer 17 calculates a variation of each of the numbers of ON cells. For example, the sequencer 17 calculates a difference between the number of ON cells OA1 read by the voltage VtrA1 and the number of ON cells OA2 read by the voltage VtrA2 (|OA1−OA2|). Likewise, the sequencer 17 calculates a difference between the numbers of ON cells read by the voltages VtrA2 and VtrA3 (|OA2−OA3|), a difference between the numbers of ON cells read by the voltages VtrA3 and VtrA4 (|OA3−OA4|), and a difference between the numbers of ON cells read by the voltages VtrA4 and VtrA5 (|OA4−OA5|). Then, the sequencer 17 sets a read voltage based on the calculation result.

More specifically, a predetermined reference value for a variation of the number of ON cells is provided, and the sequencer 17 determines Fail when a variation of the number of ON cells exceeds the reference value, and Pass when a variation of the number of ON cells is equal to or less than the reference value. By checking a variation of the number of ON cells with a certain threshold as described above, the substantial shape of the threshold voltage distributions of the memory cell transistors MT may be determined.

For example, when a variation of the number of ON cells is Pass with respect to the difference between the numbers of ON cells in the voltages VtrA1 and VtrA2 (|OA1−OA2|) and the difference between the numbers of ON cells in the voltages VtrA2 and VtrA3 (|OA2−OA3|), and Fail with respect to the difference between the numbers of ON cells in the voltages VtrA3 and VtrA4 (|OA3−OA4|) and the difference between the numbers of ON cells in the voltages VtrA4 and VtrA5 (|OA4−OA5|), it may be determined that the valley of the threshold voltage distributions in the read of the "A" level is present between the voltages VtrA1 and VtrA3 where the variation of the ON cells is small. In this case, the sequencer 17 selects, for example, the voltage VtrA2 as an optimum read voltage.

In addition, the tracking read may be similarly performed for read of the other levels. For example, in the read of the level "B," tracking read using five voltages VtrB1 to VtrB5 may be performed. In this case, the voltages VtrB1 to VtrB5 and the voltage VfyB are in the relationship of VtrB1<VfyB<VtrB5.

1.2.2 Shift Read

Subsequently, shift read is described by using FIGS. 7A to 7C. In the present embodiment, when the read of a plurality of levels is performed for the read of one page, based on a result of tracking read of one level and the read voltage table held in the register REG, the sequencer 17 sets the read voltages of the other levels of the page. Then, the sequencer 17 performs a shift read based on the set read voltages. The tables of FIGS. 7A to 7C illustrate a relationship between a tracking read and a read voltage in the lower page, the middle page, and the upper page, respectively.

As illustrated in FIG. 7A, when the lower page is read, read of the "A" and "E" levels is necessary. For example, a read voltage of the "E" level is set based on a result of the tracking read of the "A" level. For example, when a read voltage of the "A" level is VtrA2, a read voltage of the "E" level is "VfyE-Ve1." The example of FIG. 7A represents the case where the read of the "E" level is set based on the result of the tracking read of the "A" level. However, the tracking read may be first performed in the read of the "E" level, and the read voltage of the "A" level may be set based on the result. For example, when a shift amount of the "E" level is larger than a shift amount of the "A" level, a tracking read of the "E" level may be performed. Further, each inter-voltage step width among the voltages VtrA1 to VtrA5 and each inter-voltage step width among the voltages "VfyE-Ve2" to "VfyE+Ve2" may be identical to each other or different from each other. A step width of read voltages may be arbitrarily set depending on a shift amount of data of each level due to the read disturbance and the data retention. This is similarly applied to the middle page and the upper page.

As illustrated in FIG. 7B, when the middle page is read, read of the "B" level, the "D" level, and the "F" level is necessary. For example, read voltages of the "D" level and the "F" level are set based on a result of tracking read of the "B" level. For example, when a read voltage of the "B" level is VtrB2, a read voltage of the "D" level is "VfyD-Vd1," and a read voltage of the "F" level is "VfyF-Vf1." The example of FIG. 7B represents the case where the read of the "D" level and the "F" level is set based on the result of the tracking read of the "B" level. However, a tracking read may be first performed in the read of the "D" level or the "F" level, and read voltages of the other levels may be set based on the result.

As illustrated in FIG. 7C, when the upper page is read, read of the "C" level and the "G" level is necessary. For example, a read voltage of the "G" level is set based on a result of tracking read of the "C" level. For example, when a read voltage of the "C" level is VtrC2, a read voltage of the "G" level is "VfyG-Vg1." The example of FIG. 7C represents the case where the read of the "G" level is set based on the result of the tracking read of the "C" level. However, a tracking read may be first performed in the read of the "G" level, and the read voltage of the "C" level may be set based on the result.

1.2.3 Operation of Controller

Subsequently, the operation of the controller 20 is described using FIG. 8. When receiving a read instruction from an external device, the controller 20 issues a command set for a read operation and transmits the command set to the NAND type flash memory 10.

Specifically, the controller 20 first issues a read command "00h" and a command latch enable signal CLE (in a "H" level). The command "00h" corresponds to a read address input receiving command, and is a command for instructing an operation of reading data to the NAND type flash memory 10.

Subsequently, the controller 20 issues address information ADD over, for example, 5 cycles and an address latch enable signal ALE (in a "H" level). The address information ADD designates an address of an object to be read. In this case, the number of the cycles of the address information ADD is arbitrary.

Subsequently, the controller 20 issues a command "30h" and a command latch enable signal CLE (in a "H" level). The command "30h" is a command for causing the NAND type flash memory 10 to read data based on the previously transmitted command CMD and address information ADD.

The controller 20 asserts a write enable signal /WE (which is the "L" level) each time the command and the address information ADD are issued. Accordingly, whenever the write enable signal /WE is at the "L" level, a signal (the address information ADD or the command CMD) is received at the NAND type flash memory 10.

Subsequently, the NAND type flash memory 10 starts the read in response to the command "30h" and goes into the busy state (RY/(/BY)="L").

Thereafter, when the NAND type flash memory 10 returns to the ready state, the controller 20 asserts the read enable signal /RE to go to the "L" level. When the read enable signal /RE is at the "L" level, read data DAT is transmitted from the NAND type flash memory 10 to the controller 20. In the example of FIG. 8, the data is transmitted to the controller 20 in one cycle. However, the data may be transmitted in a plurality of cycles.

1.2.3 Flow of Read Operation in Semiconductor Memory Device

Subsequently, a flow of the read operation in the NAND type flash memory 10 is described using FIG. 9.

Figure 9:
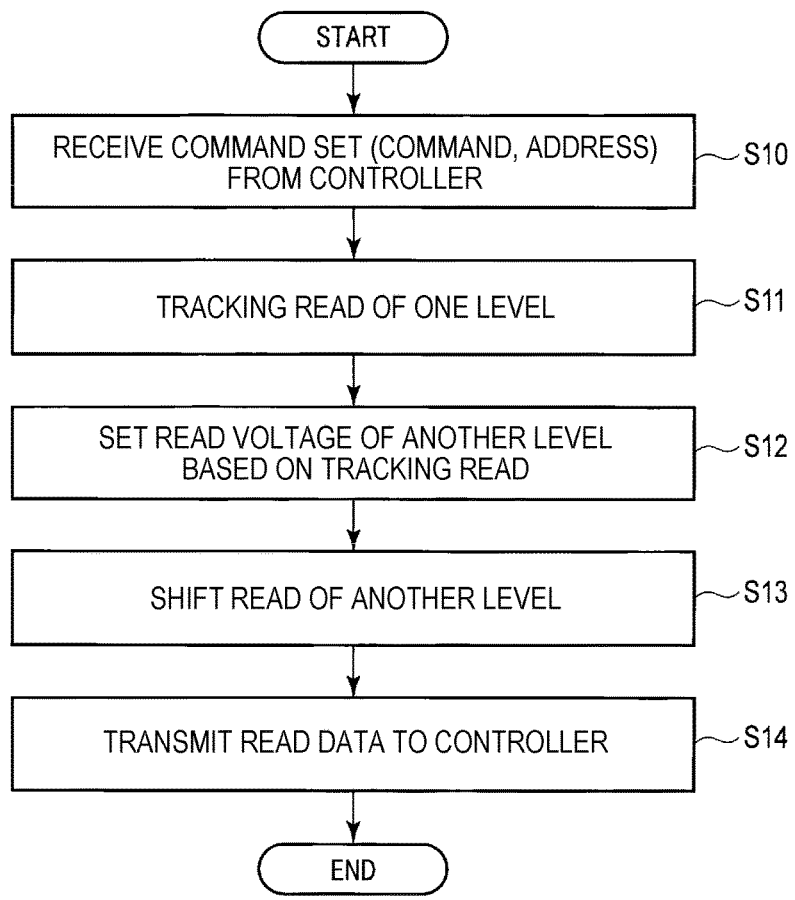
FIG. 9 is a flowchart illustrating a read operation in the semiconductor memory device according to the first embodiment.

As illustrated in FIG. 9, the NAND type flash memory 10 first receives the command set (the command CMD and the address information ADD) from the controller 20 (step S10). More specifically, the input/output circuit 14 of the NAND type flash memory 10 transmits the received command CMD and address information ADD to the command register 15C and the address register 15B, respectively. The address register 15B transmits a column address signal CA to the sense amplifier module 12, and a row address signal RA to the row decoder 13. When the command CMD is stored in the command register 15C, the ready/busy control circuit 18 controls the ready/busy signal to transition to the "L" level from the "H" level according to the control of the sequencer 17. Then, the sequencer 17 performs the read of a corresponding page.

The sequencer 17 performs a tracking read for one level (step S11). More specifically, for example, when the lower page is read, the sequencer 17 performs tracking read of the "A" level. Then, the sequencer 17 selects an optimum read voltage for the read of the "A" level, and stores the data read using the optimum read voltage in, for example, the latch circuit LDL. For example, after the read of the "A" level, data "1" is saved in the latch circuit LDL corresponding to the data of the "Er" level, and data "0" is saved in the latch circuits LDLs corresponding to the data of the "A" to "G" levels.

Subsequently, the sequencer 17 sets a read voltage of another level of the page, based on the result of the tracking read of the one level and the read voltage tables illustrated in FIG. 7A to FIG. 7C (step S12). More specifically, for example, when the lower page is read, the sequencer 17 sets a read voltage of the "E" level based on the read voltage selected in the "A" level illustrated in FIG. 7A and the read voltage tables. For example, when the voltage VtrA2 is selected as a result of the tracking read of the "A" level, the sequencer 17 selects the voltage "VfyE−Ve1" as a read voltage of the "E" level.

Subsequently, the sequencer 17 performs a shift read of another level of the page (step S13). More specifically, for example, when the lower page is read, the sequencer 17 performs a shift read of the "E" level to update the data of the latch circuit LDL. For example, data "1" is saved in the latch circuits LDLs corresponding to the data of the "Er" and "E" to "G" levels, and data "0" is saved in the latch circuits LDLs corresponding to the data of the "A" to "D" levels.

Subsequently, the sequencer 17 transmits the read data to the controller 20 (step S14). More specifically, the input/output circuit 14 of the NAND type flash memory 10 transmits the read data DAT transmitted from the sense amplifier module 12, to the controller 20. When the read data DAT is transmitted to the controller 20, the ready/busy control circuit 18 controls the ready/busy signal to transition to the "H" level from the "L" level. Accordingly, the read operation is ended.

1.2.3 Voltage of Selected Word Line during Read Operation

Subsequently, a voltage of a selected word line during a read operation is described using FIG. 10. The example of FIG. 10 illustrates the case where, in the read of the lower page, the tracking read of the "A" level is performed, and the shift read of the "E" level is performed based on the tracking read result.

Figure 10:
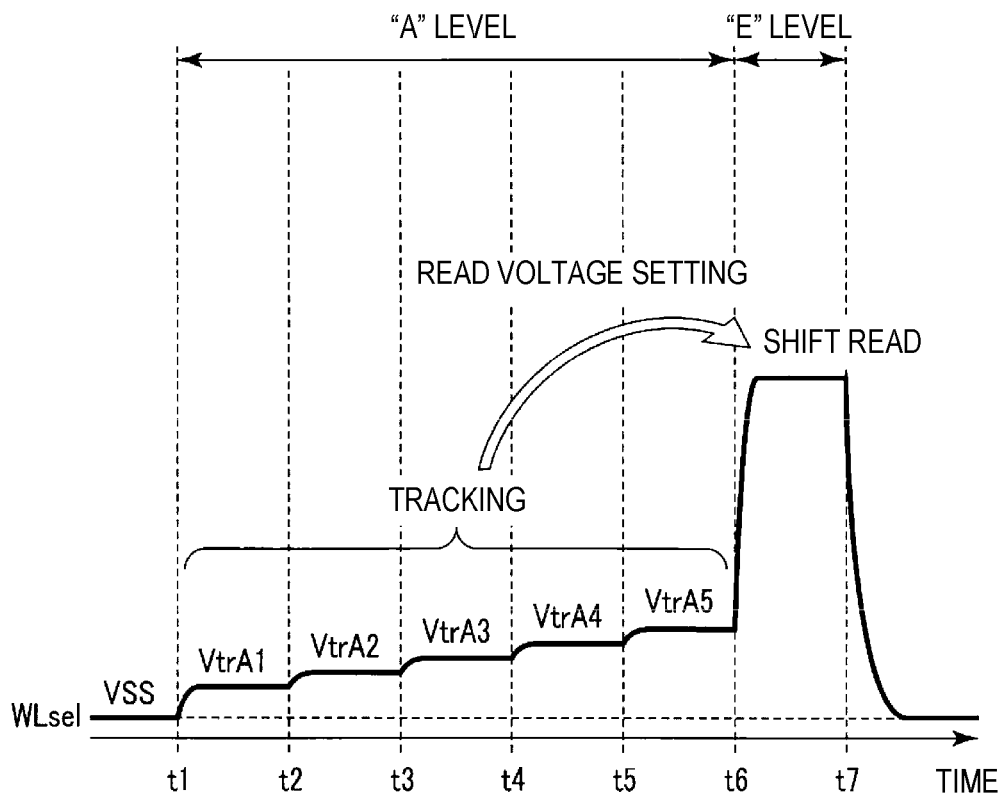
FIG. 10 is a timing chart illustrating a voltage of a selected word line during the read operation in the semiconductor memory device according to the first embodiment.

As illustrated in FIG. 10, the sequencer 17 starts the tracking read of the "A" level at a timing t1. The row decoder 13 applies the voltage VtrA1 to the selected word line WLsel. When the sequencer 17 asserts the signal STB between timings t1 and t2 during which the voltage VtrA1 is applied to the selected word line WLsel, data is read by the sense amplifier module 12.

Likewise, the row decoder 13 sequentially applies the voltages VtrA2 to VtrA5 to the selected word line WLsel during timings t2 to t6. When the sequencer 17 asserts the signal STB at each of the timings during which the voltages VtrA2 to VtrA5 are applied to the selected word line WLsel, data is read by the sense amplifier module 12.

The sequencer 17 selects an optimum read voltage from the data (the number of ON cells) read in correspondence to the voltages VtrA1 to VtrA5. Then, the sequencer 17 sets a read voltage of the "E" level based on the selected read voltage of the "A" level and the read voltage tables.

The row decoder 13 applies the read voltage of the "E" level which has been set by the sequencer 17, to the selected word line WLsel between timings t6 and t7, i.e., one of the voltages "VfyE−Ve2," "VfyE−Ve1," "VfyE," "VfyE+Ve1," and "VfyE+Ve2." During this time, the sequencer 17 asserts the signal STB to read the data of the "E" level to the sense amplifier module 12.

At the timing t7, the row decoder 13 applies the voltage VSS to the selected word line WLsel. The sequencer 17 performs a recovery process of the read operation, and the read operation is ended.

1.3 Effects of Present Embodiment

According to the semiconductor storage device of the present embodiment, the processing capability may be improved. Hereinafter, the effects of the present embodiment are described in detail.

In a semiconductor memory device, threshold voltage distributions of memory cell transistors shift from their original positions or become wider, due to the influence of, for example, the read disturbance caused by erroneous write (i.e., unintended charge injection into the charge storage layer) during a read operation or due to data retention problems caused by the discharge of charges from the charge storage layer as time lapses after a write operation.

Figure 11:
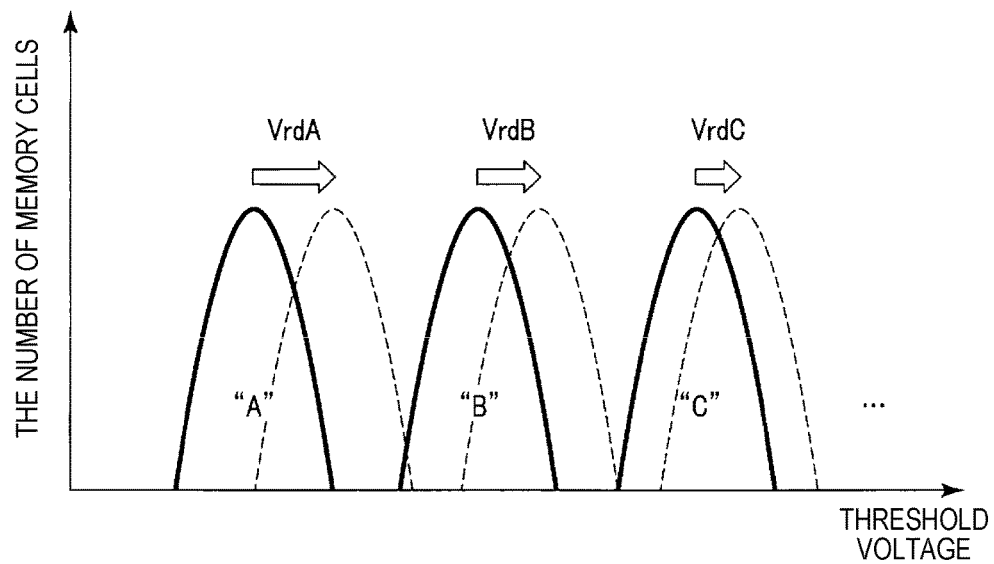
FIG. 11 is an explanatory view of a read disturbance.

FIG. 11 illustrates an example where the threshold voltage distributions of memory cell transistors shift due to the read disturbance. The example of FIG. 11 represents the threshold voltage distributions of the "A" level, the "B" level, and the "C" level. As illustrated in FIG. 11, the threshold voltage of each of the levels increases by the influence of the read disturbance. The shift amounts of the threshold voltages of the "A" level, the "B" level, and the "C" level due to the read disturbance are VrdA, VrdB, and VrdC, respectively. Then, the shift amounts are in the relationship of VrdA>VrdB>VrdC because charges are easily injected to the lower level side due to the large voltage difference between the threshold voltage and the voltage VREAD, that is, the lower level side is strongly affected by the read disturbance.

Figure 12:
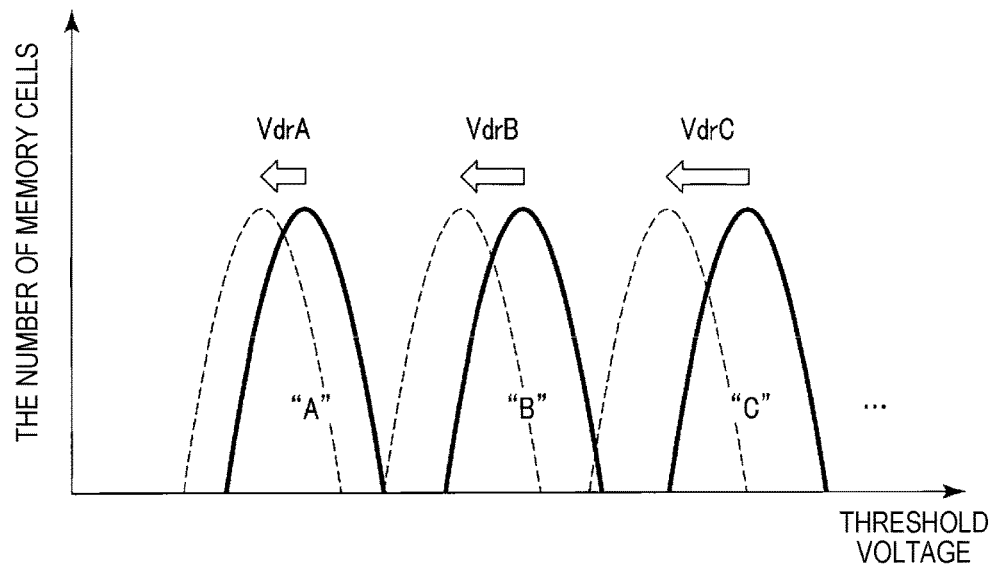
FIG. 12 is an explanatory view of data retention.

FIG. 12 illustrates an example where the threshold voltage distributions of memory cell transistors shift due to the data retention problems. The example of FIG. 12 represents the threshold voltage distributions of the "A" level, the "B" level, and the "C" level. As illustrated in FIG. 12, the threshold voltage of each of the levels decreases because of data retention problems. The shift amounts of the threshold voltages of the "A" level, the "B" level, and the "C" level due to the data retention problems are VdrA, VdrB, and VdrC, respectively. Then, the shift amounts are in the relationship of VdrA<VdrB<VdrC because the charge storage layer receives many charges so that the amount of charges discharged from the upper level side relatively increases, that is, the upper level side is strongly affected by the data retention problems.

As described above, the shift amounts of the threshold voltage distributions due to the read disturbance or the data retention problems depend on the levels of the threshold voltage distributions. By identifying in advance the relationship between the levels of the threshold voltage distributions and the shift amounts, it is possible to predict, from a shift amount of one level, a shift amount of another level.

Thus, when performing a read operation of a plurality of levels for a page to be read, the semiconductor memory device of the present embodiment performs a tracking read of one level. Then, the semiconductor memory device sets a read voltage of another level from the result of the tracking read and the read voltage tables, and performs a shift read using the read voltage. Accordingly, since it is not required to perform a tracking read for all the levels, an increase of process time for a read operation due to the tracking read may be suppressed. Therefore, the processing capability of the semiconductor memory device may be improved.

Further, erroneous read may be suppressed by the tracking read and the shift read. Thus, the reliability of the semiconductor memory device may be improved.

Further, since the number of times of the tracking read may be reduced, the influence of the read disturbance may be reduced. That is, the shift of the threshold voltages due to the read disturbance may be suppressed. Therefore, the data reliability may be improved.

2. Second Embodiment

Subsequently, a second embodiment is described. In the second embodiment, description is made on the case where the shift read of a page to be read is performed after a read voltage is set by the tracking read. Hereinafter, only the differences from the first embodiment are described.

2.1 Flow of Read Operation in Semiconductor Memory Device

Figure 13:
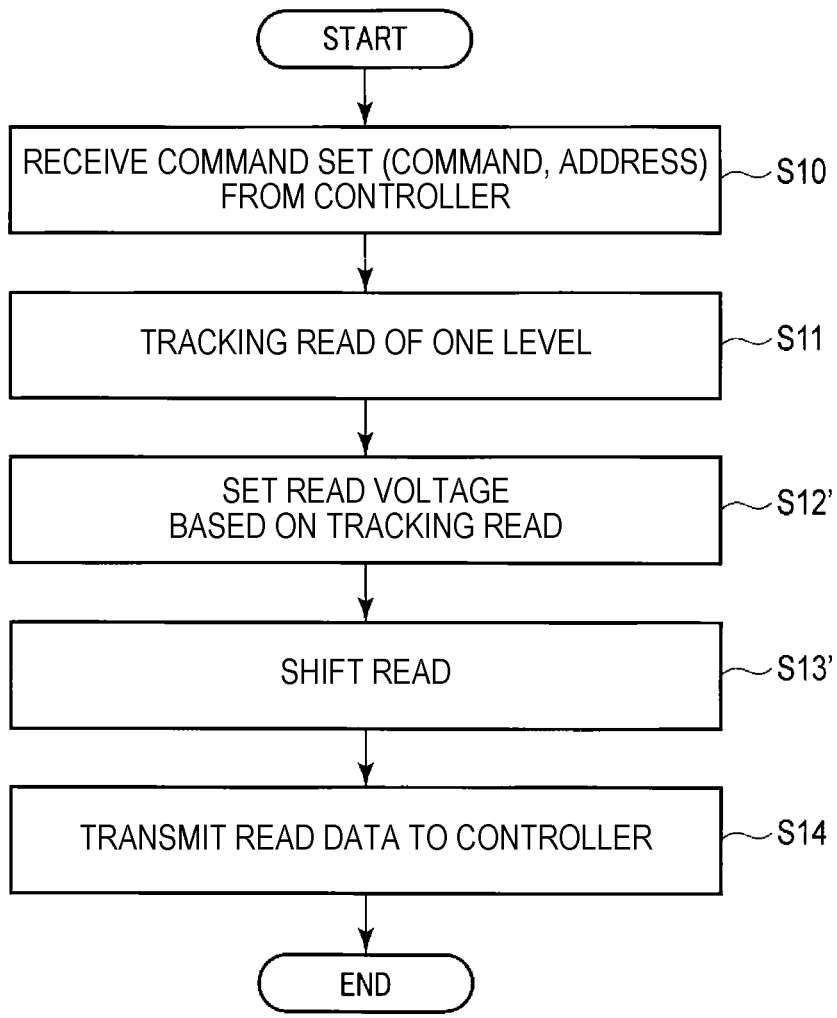
FIG. 13 is a flowchart illustrating a read operation in a semiconductor memory device according to a second embodiment.

First, a flow of a read operation in the NAND type flash memory 10 is described using FIG. 13.

As illustrated in FIG. 13, the NAND type flash memory 10 first receives the command set (the command CMD and the address information ADD) from the controller 20 (step S10).

The sequencer 17 performs a tracking read of one level (step S11). More specifically, for example, when the lower page is read, the sequencer 17 performs a tracking read of the "A" level.

Subsequently, based on the result of the tracking read and the read voltage tables, the sequencer 17 sets the read voltages of levels to be read in the page (step S12'). More specifically, when the lower page is read, the sequencer 17 sets a read voltage (e.g., the voltage VtrA2) of the "A" level and a read voltage (e.g., the voltage "VfyE−Ve1") of the "E" level.

Subsequently, the sequencer 17 performs a shift read of the page to be read (step S13'). More specifically, for example, when the lower page is read, the sequencer 17 performs a shift read of the "A" level and the "E" level to store the data in the latch circuits LDLs.

Subsequently, the sequencer 17 transmits the read data to the controller 20 (step S14).

2.2 Voltage of Selected Word Line during Read Operation

Subsequently, a voltage of a selected word line during a read operation is described using FIG. 14. The example of FIG. 14 illustrates the case where, in the read of the lower page, a tracking read of the "A" level is performed, and a shift read of the "A" level and the "E" level is performed based on the tracking read result.

Figure 14:
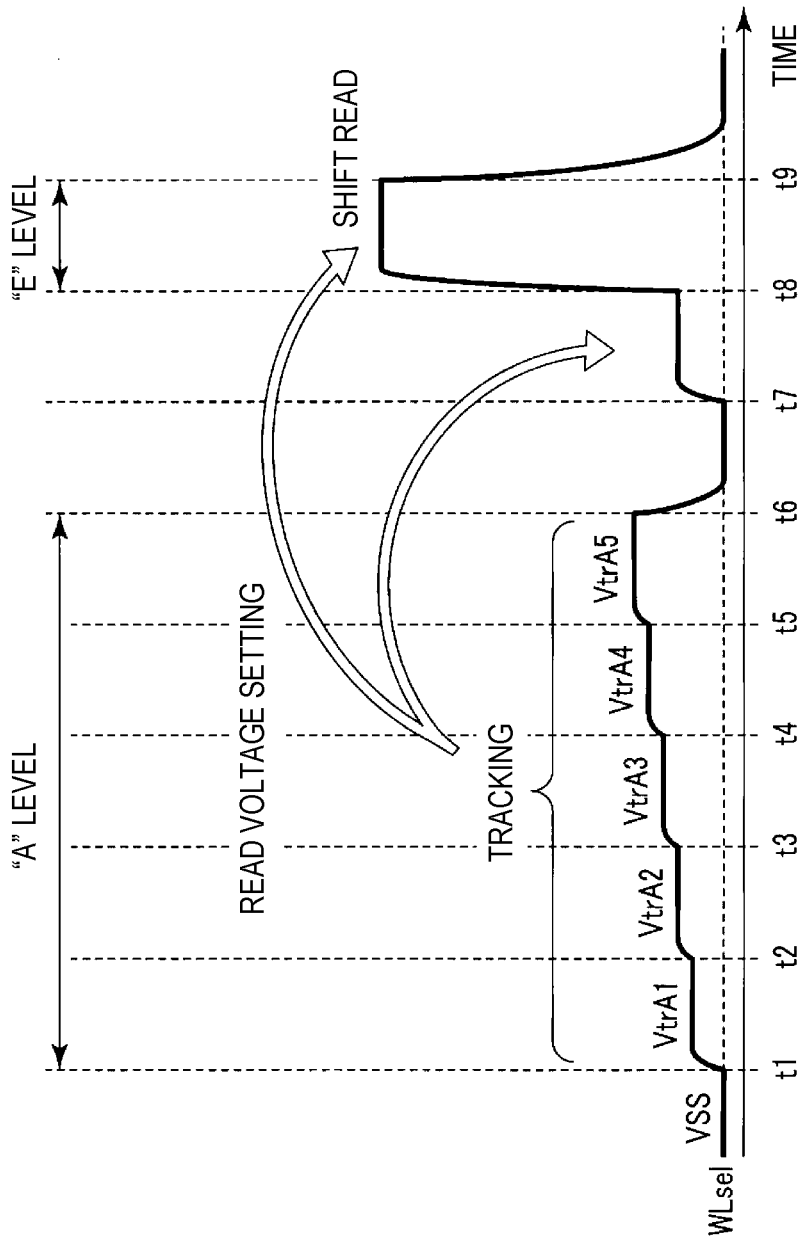
FIG. 14 is a timing chart illustrating a voltage of a selected word line during the read operation in the semiconductor memory device according to the second embodiment.

As illustrated in FIG. 14, the sequencer 17 performs the tracking read of the "A" level during timings t1 to t6, as performed during the timings t1 to t6 of FIG. 10.

The sequencer 17 sets optimum read voltages of the "A" level and the "E" level from the data read in correspondence to the voltages VtrA1 to VtrA5.

The row decoder 13 applies the voltage VSS to the selected word line WLsel between timings t6 and t7.

The row decoder 13 applies the read voltage of the "A" level which has been set by the sequencer 17, to the selected word line WLsel between timings t7 and t8. During this time, the sequencer 17 asserts the signal STB to read the data of the "A" level to the sense amplifier module 12.

The row decoder 13 applies the read voltage of the "E" level which has been set by the sequencer 17, to the selected word line WLsel between timings t8 and t9. During this time, the sequencer 17 asserts the signal STB to read the data of the "E" level to the sense amplifier module 12.

At the timing t9, the row decoder 13 applies the voltage VSS to the selected word line WLsel. The sequencer 17 performs a recovery process of the read operation, and the read operation is ended.

2.3 Regarding Effects of Present Embodiment

According to the semiconductor memory device of the present embodiment, the same effects as those of the first embodiment may be obtained.

3. Third Embodiment

Subsequently, a third embodiment is described. In the third embodiment, description is made on the case where, based on a result of the tracking read of one level, a condition of the tracking read of another level is set. Hereinafter, only the differences from the first and second embodiments are described.

3.1 Flow of Read Operation in Semiconductor Memory Device

Figure 15:
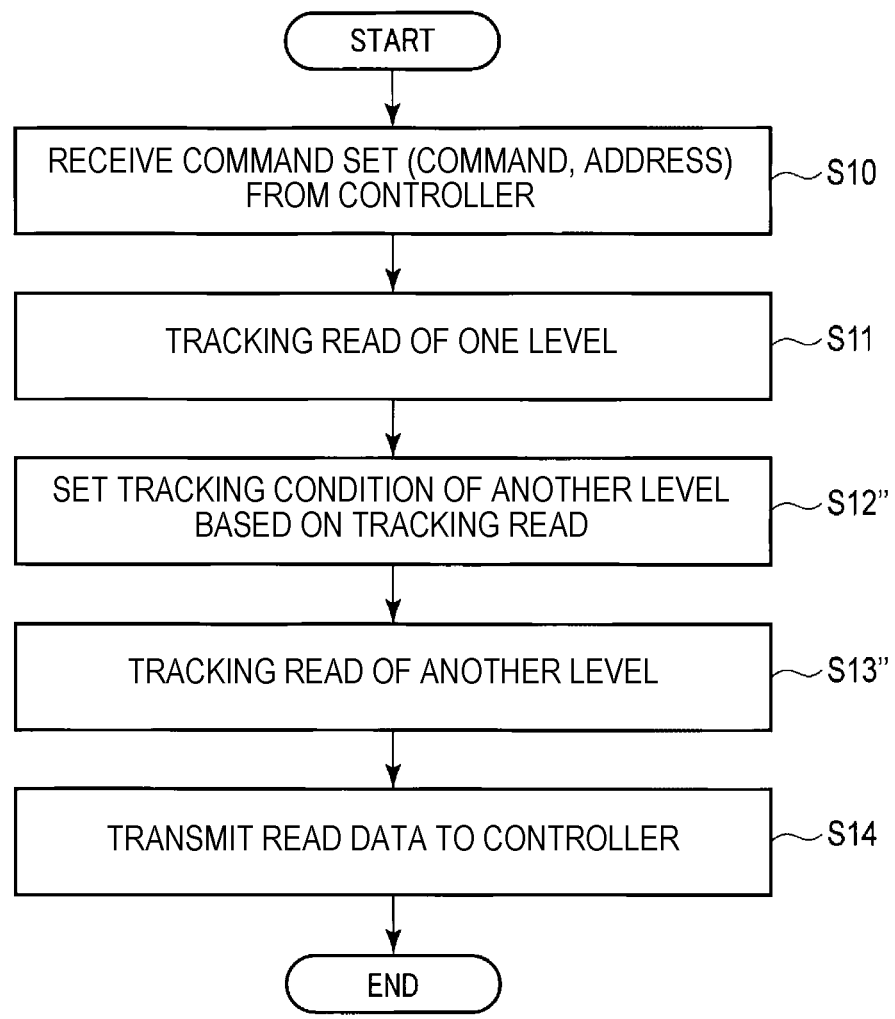
FIG. 15 is a flowchart illustrating a read operation in a semiconductor memory device according to a third embodiment.

First, a flow of a read operation in the NAND type flash memory 10 is described using FIG. 15.

As illustrated in FIG. 15, the NAND type flash memory 10 first receives the command set (the command CMD and the address information ADD) from the controller 20 (step S10).

The sequencer 17 performs a tracking read of one level (step S11). More specifically, for example, when the lower page is read, the sequencer 17 performs a tracking read of the "A" level. Then, the sequencer 17 selects an optimum read voltage of the read operation of the "A" level, and stores data read by the optimum read voltage in, for example, the latch circuit LDL.

Subsequently, based on the result of the tracking read and the read voltage tables, the sequencer 17 sets a read voltage condition for the tracking read of another level to be read in the page (hereinafter, referred to as a "tracking condition") (step S12"). More specifically, for example, when the lower page is read, the sequencer 17 sets a tracking condition of the "E" level based on the read voltage of the "A" level. By using the read result of the "A" level, the number of read times in the tracking read of the "E" level may be made smaller than the number of read times in the tracking read of the "A" level.

Subsequently, the sequencer 17 performs a tracking read of another level to be read (step S13"). More specifically, for example, when the lower page is read, the sequencer 17 performs a tracking read of the "E" level. Then, the sequencer 17 selects an optimum read voltage of the read of the "E" level, and updates the data of the latch circuit LDL based on data read by the optimum read voltage.

Subsequently, the sequencer 17 transmits the read data to the controller 20 (step S14).

3.2 Voltage of Selected Word Line during Read Operation

Subsequently, a voltage of a selected word line during a read operation is described using FIG. 16. The example of FIG. 16 illustrates a case where, in the read of the lower page, a read operation is performed eight (8) times in the tracking read of the "A" level, and read is performed three (3) times in the tracking read of the "E" level based on the result.

Figure 16:
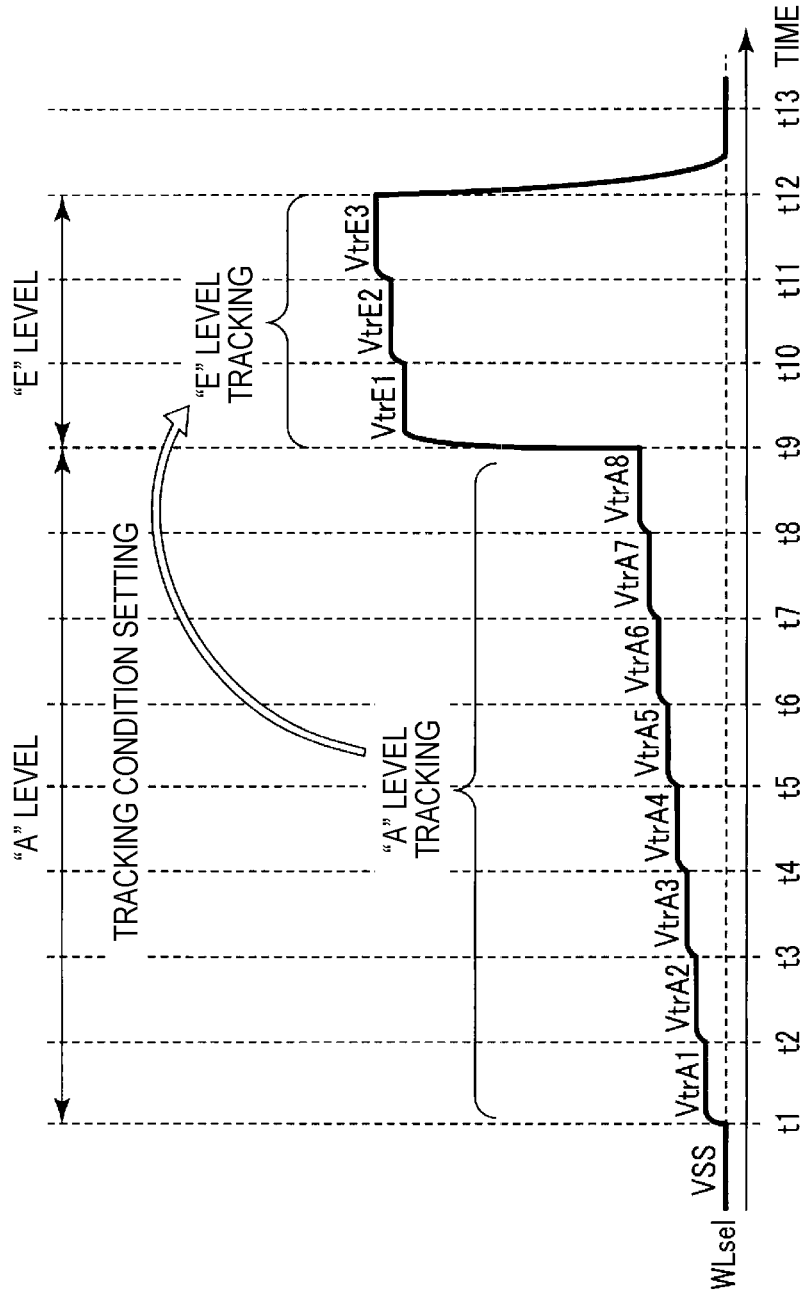
FIG. 16 is a timing chart illustrating a voltage of a selected word line during the read operation in the semiconductor memory device according to the third embodiment.

As illustrated in FIG. 16, the sequencer 17 performs the tracking read of the "A" level during timings t1 to t9. More specifically, the sequencer 17 performs the read operation eight (8) times in correspondence to voltages VtrA1 to VtrA8.

The sequencer 17 selects an optimum read voltage from the data read in correspondence to the voltages VtrA1 to VtrA8. Then, the sequencer 17 sets a tracking condition of the "E" level based on the selected read voltage of the "A" level and the read voltage tables. In the example of FIG. 16, the voltages VtrE1 to VtrE3 are selected.

During timings t9 to t12, the sequencer 17 performs a tracking read of the "E" level. More specifically, the sequencer 17 performs the read operation three (3) times in correspondence to the voltages VtrE1 to VtrE3. Then, the sequencer 17 selects an optimum read voltage from the data read in correspondence to the voltages VtrE1 to VtrE3.

At a timing t12, the row decoder 13 applies the voltage VSS to the selected word line WLsel. The sequencer 17 performs a recovery process of the read operation, and the read operation is ended.

3.3 Effects of Present Embodiment

When performing a read operation of a plurality of levels for a page to be read, the semiconductor memory device of the present embodiment performs a tracking read of one level. Then, from the result of the tracking read and the read voltage tables, the semiconductor memory device sets a read voltage for performing a tracking read of another level. Accordingly, when a tracking read of another level is performed, the tracking read may be performed using a read voltage close to a predicted optimum value. Thus, since the number of read times in the tracking read may be reduced, an increase of process time of the read operation due to the tracking read of another level may be suppressed. Therefore, the processing capability of the semiconductor memory device may be improved.

Further, in the configuration according to the present embodiment, an optimum read voltage of each level may be set even when a shift amount of a threshold voltage distribution of each level varies due to, for example, a variation of a size of a memory cell transistor MT or a variation of characteristics of a memory cell transistor MT. Thus, the reliability of the semiconductor memory device may be improved while suppressing erroneous read.

4. Fourth Embodiment

Subsequently, a semiconductor memory device and a memory system according to a fourth embodiment are described. A difference from the first embodiment lies in that the NAND type flash memory 10 performs a tracking read according to an instruction of the controller 20. Hereinafter, only the differences from the first to third embodiments are described.

4.1 Operation of Controller

Figure 8:
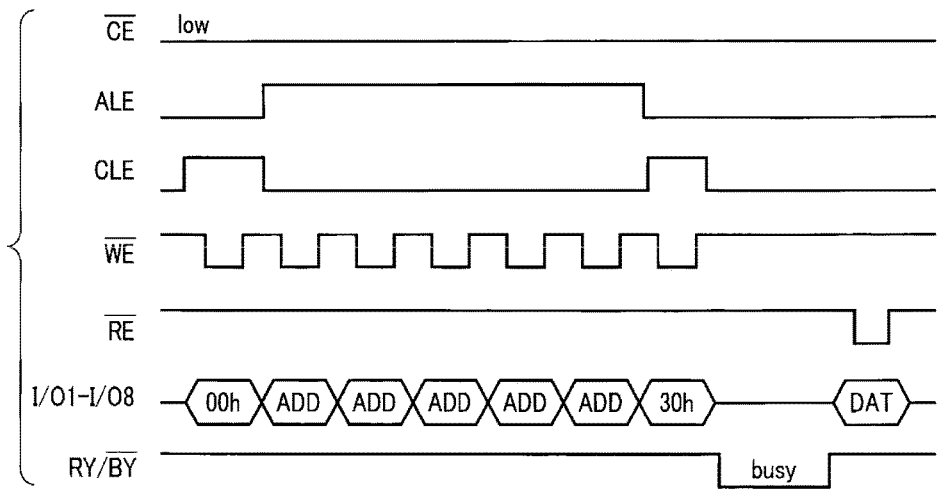
FIG. 8 is a timing chart of various signals during a read operation in the memory system according to the first embodiment.
Figure 17:
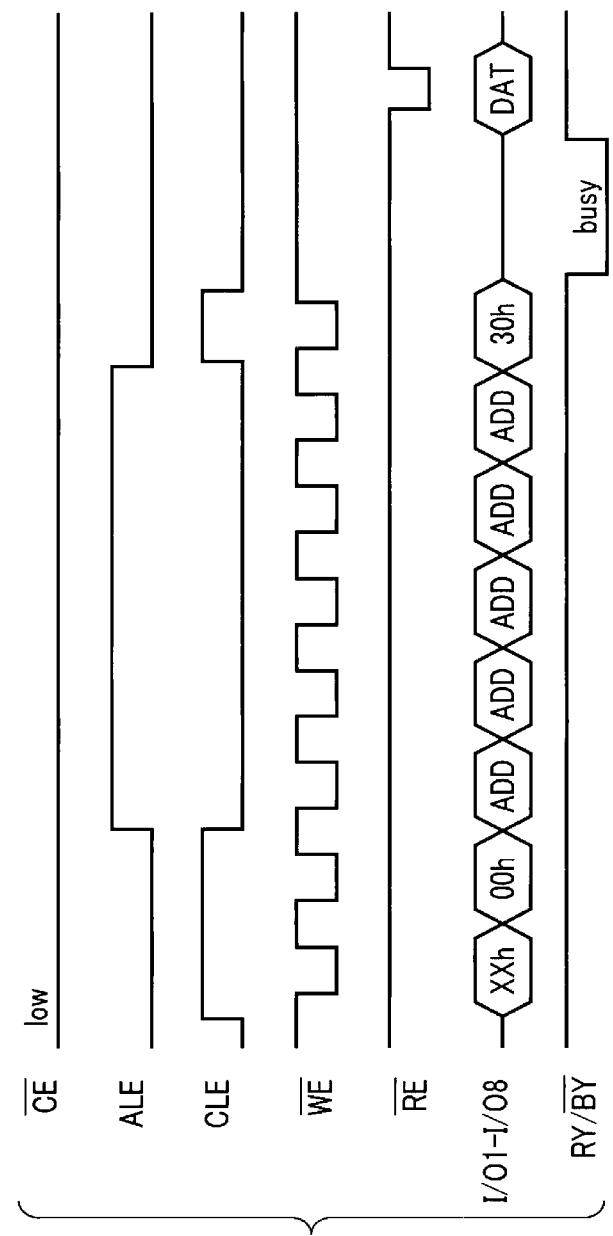
FIG. 17 is a timing chart of various signals during a read operation in a memory system according to a fourth embodiment.

First, an operation of the controller 20 is described using FIG. 17, which is different from FIG. 8 of the first embodiment in that a prefix command "XXh" is issued prior to an issuance of the read command "00h." The command "XXh" is a command for instructing a tracking read to the NAND type flash memory 10. The NAND type flash memory 10 performs a tracking read when receiving the command "XXh," and performs a normal read when receiving the command "XXh" is not received.

4.2 Regarding a Flow of the Entire Read Operation

Figure 18:
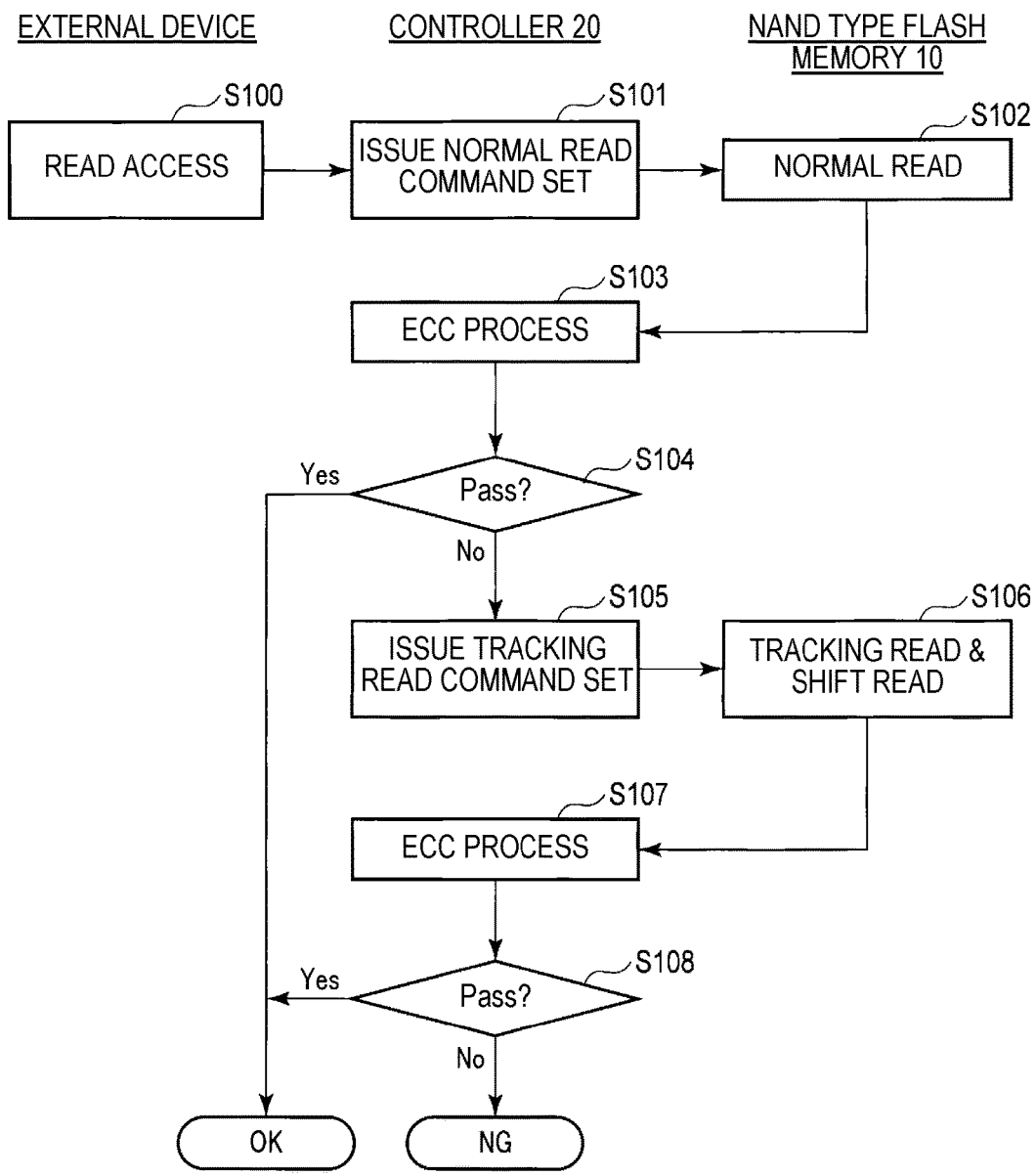
FIG. 18 is a flowchart illustrating the read operation in the memory system according to the fourth embodiment.

Subsequently, a flow of the entire read operation is described using FIG. 18. The example of FIG. 18 represents a case where tracking read is performed for a page of which data may not be normally read by normal read.

First, the controller 20 receives read access from an external device through the host interface circuit 26 (step S100). The processor 21 issues a command set (a command and address information ADD) for performing normal read, and transmits the command set to the NAND type flash memory 10 through the NAND interface circuit 24 (step S101). That is, the processor 21 issues the read command "00h" without issuing the prefix command "XXh."

Subsequently, the sequencer 17 of the NAND type flash memory 10 performs a normal read (step S102). More specifically, for example, when the lower page is read, the sequencer 17 performs the read operations using the read voltage VfyA of the "A" level and the read voltage of VfyE of the "E" level, and transmits the read data to the controller 20.

Subsequently, the controller 20 causes the read data to be held in, for example, the buffer memory 25. Then, the ECC circuit 23 performs an ECC process, and determines Pass/Fail of the ECC process (step S103).

When it is determined that the ECC process passed (step S104_Yes), the ECC process of the page is ended. Then, the processor 21 transmits the corrected data from the host interface circuit 26 to the external device, and the read operation is completed.

Meanwhile, when it is determined that the ECC process failed (step S104_No), that is, when the number of defective bits has been larger than a regulated number, and the defective bits could not have been corrected to be equal to or less than the regulated number, the processor 21 issues a command set for performing tracking read (and shift read), and transmits the command set to the NAND type flash memory 10 through the NAND interface circuit 24 (step S105). That is, the processor 21 issues the read command "00h" after issuing the prefix command "XXh."

Subsequently, the sequencer 17 of the NAND type flash memory 10 performs a tracking read (step S106). More specifically, for example, as represented in the first embodiment, the tracking read of one level is performed, and a shift read of another level is performed using a read voltage set based on the tracking read. When the tracking read and the shift read are ended, the sequencer 17 transmits the read data to the controller 20.

Subsequently, the controller 20 performs an ECC process, as in the step S103 (step S107).

When it is determined that the ECC process passed (step S108_Yes), the ECC process of the page is ended. Then, the processor 21 transmits the corrected data from the host interface circuit 26 to the external device, and the read operation is completed.

Meanwhile, when it is determined that the ECC process failed (step S108_No), the processor 21 determines that the operation of reading the data from the page has been failed, and reports the failure to the external device.

4.3 Effects of Present Embodiment

According to the memory system of the present embodiment, the same effects as those of the first to third embodiments may be obtained.

Further, in the configuration according to the present embodiment, the controller 20 may instruct the performance of tracking read. Accordingly, when it is determined that a tracking read is necessary, the controller 20 may cause the performance of the tracking read. Thus, the performance frequency of the tracking read may be reduced, and the increase of process time of a read operation may be suppressed. Therefore, the processing capability of the memory system may be improved.

5. Fifth Embodiment

Subsequently, a semiconductor memory device and a memory system according to a fifth embodiment are described. A difference from the fourth embodiment lies in that the controller 20 determines the necessity of a tracking read based on previous read information. Hereinafter, only differences from the fourth embodiment are described.

5.1 Flow of Entire Read Operation

Figure 19:
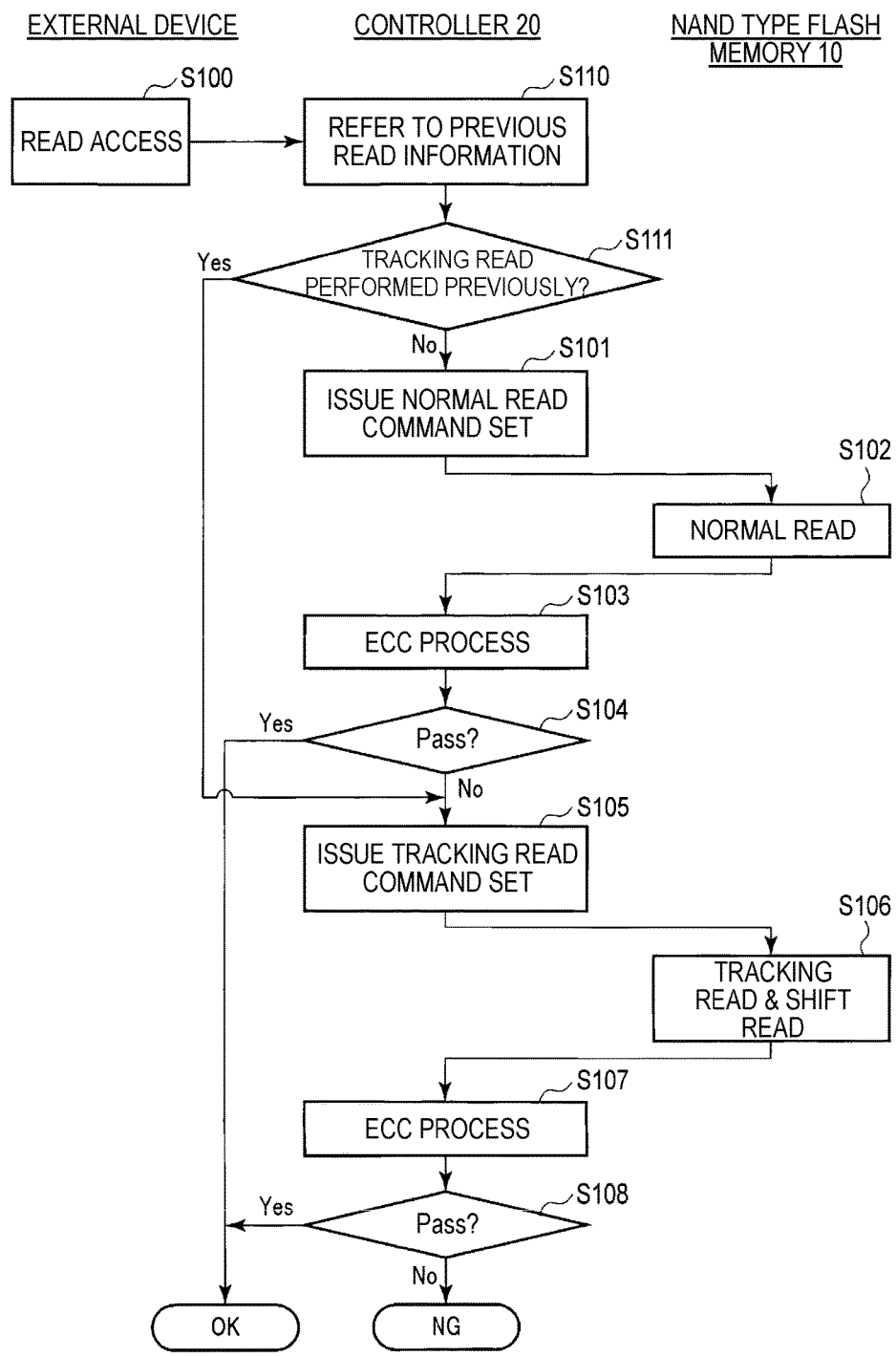
FIG. 19 is a flowchart illustrating a read operation in a memory system according to a fifth embodiment.

Subsequently, a flow of the entire read operation is described using FIG. 19.

Upon receiving the read access from the external device (step S100), the controller 20 selects one of a normal read and a tracking read with reference to previous read information saved in, for example, the built-in memory 22 (step S110). The previous read information is information of whether a tracking read was performed when the page was previously read.

When it is determined that a tracking read was previously performed (step S111_Yes), the processor 21 selects the tracking read of the step S105 while omitting the normal read.

Meanwhile, when it is determined that a tracking read was not previously performed (step S111_No), the processor 21 selects the normal read of the step S101. The follow-up processes are the same as those in the third embodiment.

5.2 Effects of Present Embodiment

According to the semiconductor memory device of the present embodiment, the same effects as those in the first to fourth embodiments may be obtained.

6. Sixth Embodiment

Subsequently, a semiconductor memory device and a memory system according to a sixth embodiment are described. The sixth embodiment is different from the fourth embodiment in that a full tracking read is performed when it is determined in step S18 of FIG. 18 in the fourth embodiment that the ECC process failed. As for the full tracking read, when a read operation of a plurality of levels is performed for a page to be read, a tracking read is performed for all the levels to be read. In the full tracking read, tracking read of each level is performed based on a preset read voltage value without referring to a read result of another level. Hereinafter, only differences from the fourth embodiment are described.

6.1 Regarding an Operation of the Controller

Figure 20:
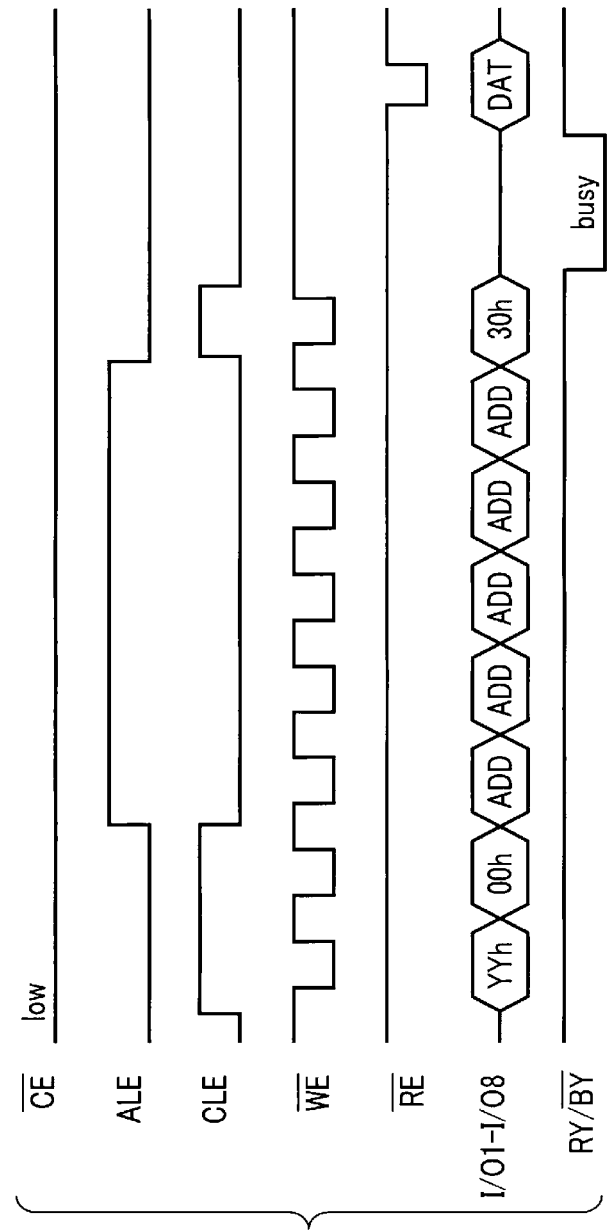
FIG. 20 is a timing chart of various signals during a read operation in a memory system according to a sixth embodiment.

First, an operation of the controller 20 is described using FIG. 20, which is different from FIG. 17 of the fourth embodiment in that a prefix command "YYh" is issued prior to the issuance of the read command "00h." The command "YYh" is a command for instructing the full tracking read to the NAND type flash memory 10. Upon receiving the command "YYh," the NAND type flash memory 10 performs the full tracking read.

6.2 Flow of Entire Read Operation

Subsequently, a flow of the entire read operation is described using FIG. 21. The steps S100 to S108 of FIG. 21 are the same as those in FIG. 18 of the fourth embodiment. Hereinafter, only the differences from FIG. 18 are described.

When it is determined in the step S108 that the ECC process failed, the controller 20 issues a command set for performing the full tracking read, and transmits the command set to the NAND type flash memory 10 through the NAND interface circuit (step S120). That is, the processor 21 issues the read command "00h" after issuing the prefix command "YYh."

Subsequently, the sequencer 17 of the NAND type flash memory 10 performs the full tracking read (step S121). More specifically, for example, when the lower page is read, the sequencer 17 performs a tracking read of the "A" level and the "E" level, and transmits the read data to the controller 20.

Subsequently, the controller 20 causes the read data to be held in, for example, the buffer memory 25. Then, the ECC circuit 23 performs an ECC process, and determines Pass/Fail of the ECC process (step S122).

When it is determined that the ECC process passed (step S123_Yes), the ECC process of the page is ended. Then, the processor 21 transmits the corrected data from the host interface circuit 26 to the external device, and the read operation is completed.

Meanwhile, when it is determined that the ECC process failed (step S123_No), the processor 21 determines that the operation of reading the data from the page has been failed, and reports the failure to the external device.

6.3 Effects of Present Embodiment

According to the memory system of the present embodiment, the same effects as those in the first to fifth embodiments may be obtained.

In addition, instead of the full tracking read, the third embodiment may be applied.

7. Modifications and Others

The semiconductor memory device according to the above-described embodiments includes a memory cell array (11 in FIG. 2) including plural memory cells (MT in FIG. 3) capable of storing one of first and second data corresponding to first and second threshold voltage distributions ("A" and "E" levels in FIG. 10), respectively, a word line connected in common to the plural memory cells (WL in FIG. 3), and a control circuit that performs a read operation (17 in FIG. 3). When the first data is read ("A" level in FIG. 10), the control circuit performs a read operation at least three times by applying at least first to third voltages (e.g., VtrA2 to VtrA4 in FIG. 10) to the word line. When the second data is read ("E" level in FIG. 10), the control circuit performs a read operation by applying a fourth voltage (e.g., "VfyE–Ve1" in FIG. 7A) to the word line based on the read result of the first data.

By applying the above-described embodiments, a semiconductor memory device with an improved process capability may be provided. Meanwhile, the embodiments are not limited to those described above, and may be variously modified.

For example, in the fourth embodiment, the processor 21 selects one of a normal read and a tracking read based on previous read information. However, a tracking read may be selected according to, for example, the number of rewrite times of the memory cell transistors MT.

Further, the above-described embodiments are not limited to the flat NAND type flash memory, and may be applied to a three-dimensional stacked NAND type flash memory in which memory cells are stacked on a semiconductor substrate. Furthermore, the embodiments are not limited to the NAND type flash memory, and may also be applied to a semiconductor memory device using a memory element capable of holding two or more-bit data.

In the above-described embodiments, the "connection" includes a state where objects are indirectly connected to each other while another object such as a transistor or a resistance is interposed therebetween.

In addition, each of the embodiments may be configured as follows. For example, it is assumed that a memory cell transistor MT is able to hold 2-bit (4 levels) data, and when any one of the four levels is held, threshold levels are an E level (erase level), an A level, a B level, and a C level in an order of ascending levels.

(1) In a read operation, a voltage which is applied to a selected word line for a read operation of the A level is, for example, 0 V to 0.55 V. The voltage is not limited thereto, and may be any one of 0.1 V to 0.24 V, 0.21 V to 0.31 V, 0.31 V to 0.4 V, 0.4 V to 0.5 V, and 0.5 V to 0.55 V.

A voltage which is applied to a selected word line for a read operation of the B level is, for example, 1.5 V to 2.3 V. The voltage is not limited thereto, and may be any one of 1.65 V to 1.8 V, 1.8 V to 1.95 V, 1.95 V to 2.1 V, 2.1 V to 2.3 V.

A voltage which is applied to a selected word line for a read operation of the C level is, for example, 3.0 V to 4.0 V. The voltage is not limited thereto, and may be any one of 3.0 V to 3.2 V, 3.2 V to 3.4 V, 3.4 V to 3.5 V, 3.5 V to 3.6 V, and 3.6 V to 4.0 V.

Time tR for the read operation may be, for example, 25 μs to 38 μs, 38 μs to 70 μs, or 70 μs to 80 μs.

(2) The write operation includes a program operation and a verification operation as described above. In the write operation, a voltage which is first applied to a selected word line for the program operation is, for example, 13.7 V to 14.3 V. The voltage is not limited thereto, and may be, for example, any one of 13.7 V to 14.0 V and 14.0 V to 14.6 V.

A voltage which is first applied to a selected word line in writing odd-numbered word lines may be exchanged with a voltage which is first applied to a selected word line in writing even-numbered word lines.

When the program operation is performed by an incremental step pulse program (ISPP) method, a step-up voltage may be, for example, about 0.5 V.

A voltage which is applied to a non-selected word line may be, for example, 6.0 V to 7.3V. The voltage is not limited thereto, and may be, for example, 7.3 V to 8.4 V or 6.0 V or lower.

The pass voltage to be applied may be changed depending on whether a non-selected word line is an odd-numbered word line or an even-numbered word line.

The time (tProg) for the write operation may be, for example, 1,700 μs to 1,800 μs, 1,800 μs to 1,900 μs, or 1,900 μs to 2,000 μs.

(3) In the erase operation, a voltage which is first applied to a well formed on the semiconductor substrate and arranged with the memory cells thereon is, for example, 12 V to 13.6 V. The voltage is not limited thereto, and may be, for example, 13.6 V to 14.8 V, 14.8 V to 19.0 V, 19.0 to 19.8 V, or 19.8 V to 21 V.

Time (tErase) for the erase operation may be, for example, 3,000 μs to 4,000 μs, 4,000 μs to 5,000 μs, or 4,000 μs to 9,000 μs.

(4) The structure of a memory cell has a charge storage layer which is arranged on the semiconductor substrate (silicon substrate) via a tunnel insulation film having a film thickness of 4 nm to 10 nm. The charge storage layer may have a stacked structure of an insulation film having a film thickness 2 nm to 3 nm such as SiN or SiON and polysilicon having a film thickness of 3 nm to 8 nm. Metals such as Ru may be added to the polysilicon. An insulation film is provided on the charge storage layer. The insulation film has, for example, a lower-layer High-k film having a film thickness of 3 nm to 10 nm, an upper-layer High-k film having a film thickness of 3 nm to 10 nm, and a silicon oxide film having a film thickness of 4 nm to 10 nm that is sandwiched between the lower-layer film and the upper-layer film. The High-k film may be, for example, HfO. The film thickness of the silicon oxide film may be made thicker than the film thickness of the High-k films. A control electrode having a film thickness of 30 nm to 70 nm is formed on the insulation film via a material having a film thickness 3 nm to 10 nm. Such a material may be a metal oxide film such as TaO or a metal nitride film such as TaN. For example, W may be used for the control electrode.

In addition, an air gap may be formed between memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell array including a plurality of memory cells;
a word line connected in common to gates of the memory cells; and
a control circuit configured to execute read operations on the memory cells to read at least three pages of data,
wherein the control circuit, in response to an instruction to read one page of data, executes a first phase during which at least first to third voltages are applied to the word line to determine for each of the memory cells whether or not the memory cell has a threshold voltage that is below a first read voltage and a second phase during which a second read voltage is applied to the word line to determine for each of the memory cells whether or not the memory cell has a threshold voltage that is below the second read voltage,
wherein the control circuit determines the second read voltage based on the first read voltage.

2. The semiconductor memory device according to claim 1, further comprising:
a plurality of bit lines connected to the plurality of memory cells, respectively; and
a sense amplifier connected to the plurality of bit lines,
wherein the sense amplifier includes a counter that is configured to count a number of the plurality of memory cells which are in an ON state, and
the control circuit is configured to determine one of the first to third voltages as the first read voltage based on a count value from the counter after a read is performed using each of the first to third voltages as a read voltage.

3. The semiconductor memory device according to claim 1, wherein the first read voltage is equal to one of the at least first to third voltages.

4. The semiconductor memory device according to claim 2, wherein the control circuit includes a table that includes an entry corresponding to each of the at least first to third voltages and determines the second read voltage using the entry of the table that corresponds to one of the at least first to third voltages that is equal to the first read voltage.

5. The semiconductor memory device according to claim 4, wherein the table is rewritable.

6. The semiconductor memory device according to claim 1, wherein the controller determines the second read voltage by applying at least fourth to sixth voltages to the word line, which are determined based on the first read voltage, to the word line.

7. A memory system comprising:
a controller; and
a semiconductor memory device including a memory cell array including a plurality of memory cells, a word line connected in common to gates of the memory cells, and a control circuit configured to perform a normal read in response to a normal read command issued by the controller and a tracking read in response to a tracking read command issued by the controller, wherein
the control circuit performs a tracking read on the memory cells to read one page of data by executing a first phase during which at least first to third voltages are applied to the word line to determine for each of the memory cells whether or not the memory cell has a threshold voltage that is below a first read voltage and a second phase during which a second read voltage is applied to the word line to determine for each of the memory cells whether or not the memory cell has a threshold voltage that is below the second read voltage, and
the control circuit determines the second read voltage based on the first read voltage.

8. The memory system according to claim 7, wherein the semiconductor memory devices further includes:
a plurality of bit lines connected to the plurality of memory cells, respectively; and
a sense amplifier connected to the plurality of bit lines,
wherein the sense amplifier includes a counter that is configured to count a number of the plurality of memory cells which are in an ON state, and
the control circuit is configured to determine one of the first to third voltages as the first read voltage based on a count value from the counter after a read is performed using each of the first to third voltages as a read voltage.

9. The memory system according to claim 7, wherein the first read voltage is equal to one of the at least first to third voltages.

10. The memory system according to claim 9, wherein the control circuit includes a table that includes an entry corresponding to each of the at least first to third voltages and determines the second read voltage using the entry of the table that corresponds to one of the at least first to third voltages that is equal to the first read voltage.

11. The memory system according to claim 10, wherein the table is rewritable.

12. The memory system according to claim 7, wherein the controller determines the second read voltage by applying at least fourth to sixth voltages to the word line, which are determined based on the first read voltage, to the word line.

13. The memory system according to claim 7, wherein the controller is configured to issue the tracking read command to the semiconductor memory device to read data of the memory cells after issuing the normal read command to the semiconductor memory device to read data of the memory cells and determining a read failure.

14. The memory system according to claim 7, wherein the controller is configured to determine whether the tracking read command was previously issued to the semiconductor memory device to read data of the memory cells, and to issue the tracking read command to the semiconductor memory device to read data of the memory cells upon determining that the tracking read command was previously issued.

15. The memory system according to claim 7, wherein the control circuit configured to also perform a full tracking read and the controller is configured to issue the full tracking read command to the semiconductor memory device to read data of the memory cells after determining a read failure of the normal read command issued to the semiconductor memory device and a read failure of the tracking read command issued to the semiconductor memory device.

16. The memory system according to claim 15, wherein the control circuit performs the full tracking read by applying the first read voltage to the word line to determine for each of the memory cells whether or not the memory cell has a threshold voltage that is below the first read voltage and a third read voltage to the word line to determine for each of the memory cells whether or not the memory cell has a threshold voltage that is below the third read voltage, and
the control circuit determines the third read voltage by applying at least fourth to sixth voltages to the word line.

17. A method of performing a read in a semiconductor memory device including a memory cell array including a plurality of memory cells and a word line connected in common to gates of the memory cells, said method comprising:
in response to an instruction to read one page of data, executing a first phase during which at least first to third voltages are applied to the word line to determine for each of the memory cells whether or not the memory cell has a threshold voltage that is below a first read voltage and a second phase during which a second read voltage is applied to the word line to determine for each of the memory cells whether or not the memory cell has a threshold voltage that is below the second read voltage; and
after executing the first phase and before executing the second phase, determining the second read voltage based on the first read voltage.

18. The method according to claim 17, wherein the semiconductor memory device further includes a plurality of bit lines connected to the plurality of memory cells, respectively, and a sense amplifier connected to the plurality of bit lines, the sense amplifier including a counter that is configured to count a number of the plurality of memory cells which are in an ON state, said method further comprising:
determining one of the first to third voltages as the first read voltage based on a count value from the counter after a read is performed using each of the first to third voltages as a read voltage.

19. The method according to claim 17, wherein the first read voltage is equal to one of the at least first to third voltages.

20. The method according to claim 17, wherein determining the second read voltage includes:
applying at least fourth to sixth voltages, which are determined based on the first read voltage, to the word line.

21. The semiconductor memory device according to claim 1, wherein during and between the first phase and the second phase, the control circuit increases a voltage applied to the word line, and does not decrease the voltage applied to the word line.

22. The semiconductor memory device according to claim 1, further comprising:
a ready/busy control circuit configured to generate and output a ready signal or a busy signal based on an operation state of the control circuit, wherein
during and between the first phase and the second phase, the ready/busy control circuit outputs the busy signal.

* * * * *